United States Patent
Tamiya

(10) Patent No.: US 8,621,295 B2
(45) Date of Patent: Dec. 31, 2013

(54) CIRCUIT MODULE, SEMICONDUCTOR INTEGRATED CIRCUIT, AND INSPECTION APPARATUS AND METHOD THEREOF

(75) Inventor: Yutaka Tamiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 142 days.

(21) Appl. No.: 12/620,727

(22) Filed: Nov. 18, 2009

(65) Prior Publication Data

US 2010/0251047 A1   Sep. 30, 2010

(30) Foreign Application Priority Data

Mar. 24, 2009   (JP) .................................. 2009-72182

(51) Int. Cl.
*G01R 31/28* (2006.01)
(52) U.S. Cl.
USPC ............. 714/726; 714/727; 714/729; 714/30
(58) Field of Classification Search
None
See application file for complete search history.

(56) References Cited

U.S. PATENT DOCUMENTS

| | | | | |
|---|---|---|---|---|
| 5,056,093 A | * | 10/1991 | Whetsel | 714/729 |
| 5,150,044 A | * | 9/1992 | Hashizume et al. | 324/750.3 |
| 5,260,949 A | * | 11/1993 | Hashizume et al. | 714/731 |
| 5,448,575 A | * | 9/1995 | Hashizume | 714/727 |
| 5,703,884 A | * | 12/1997 | Ozaki | 714/30 |
| 5,911,039 A | * | 6/1999 | Hashizume et al. | 714/30 |
| 5,925,143 A | * | 7/1999 | Gillis et al. | 714/726 |
| 6,158,032 A | * | 12/2000 | Currier et al. | 714/726 |
| 6,487,682 B2 | * | 11/2002 | Yamamura et al. | 714/30 |
| 2003/0070128 A1 | * | 4/2003 | Akasaka et al. | 714/726 |

FOREIGN PATENT DOCUMENTS

| | | |
|---|---|---|
| JP | 03-262048 | 11/1991 |
| JP | 2676169 | 7/1997 |
| JP | 2738351 | 4/1998 |
| JP | 2004-077356 | 3/2004 |

OTHER PUBLICATIONS

Office Action of Japanese Patent Application No. 2009-072182 dated Oct. 29, 2013.

* cited by examiner

*Primary Examiner* — John Trimmings
(74) *Attorney, Agent, or Firm* — Staas & Halsey LLP

(57) ABSTRACT

A circuit module includes a shift register constituting part of a scan chain within a semiconductor integrated circuit, a control unit for controlling an operation of the shift register using a control signal generated within the semiconductor integrated circuit and a selection unit for selecting between a short-circuit path through which a scan signal is loaded and an ordinary path through which the scan signal is loaded after being made to go through the shift register, where the ordinary path is selected when the operation of the shift register is permitted by the control signal and the short-circuit path is selected when the operation of the shift register is not permitted.

9 Claims, 21 Drawing Sheets

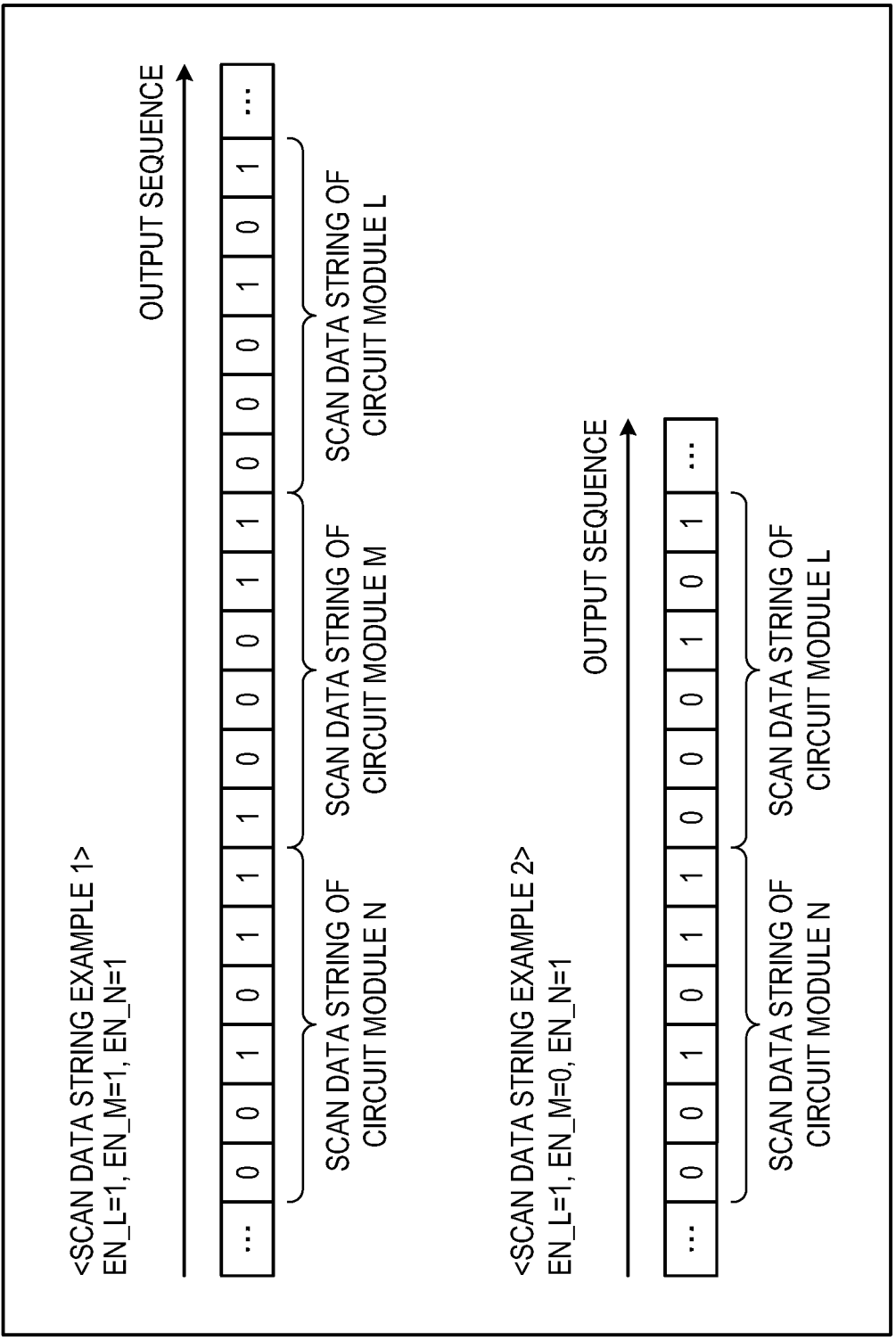

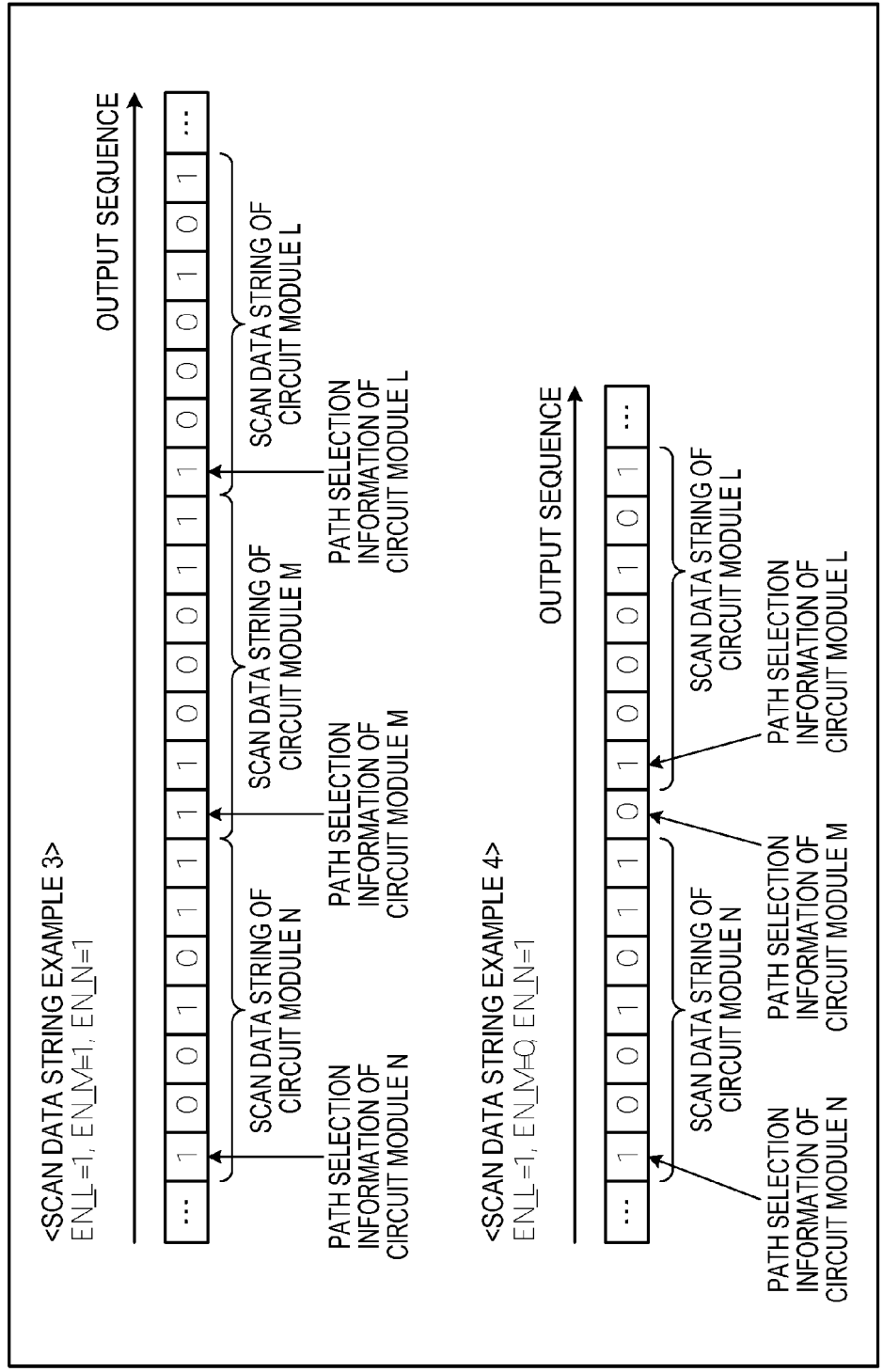

FIG.6A

| CIRCUIT MODULE NAME | PATH SELECTION INFORMATION |
|---|---|
| CIRCUIT MODULE N | 1 |
| CIRCUIT MODULE M | 1 |
| CIRCUIT MODULE L | 1 |
| ⋮ | ⋮ |

FIG.6B

| FF NAME | CIRCUIT MODULE NAME |
|---|---|
| FF14 | CIRCUIT MODULE M |
| FF15 | CIRCUIT MODULE L |
| ⋮ | ⋮ |

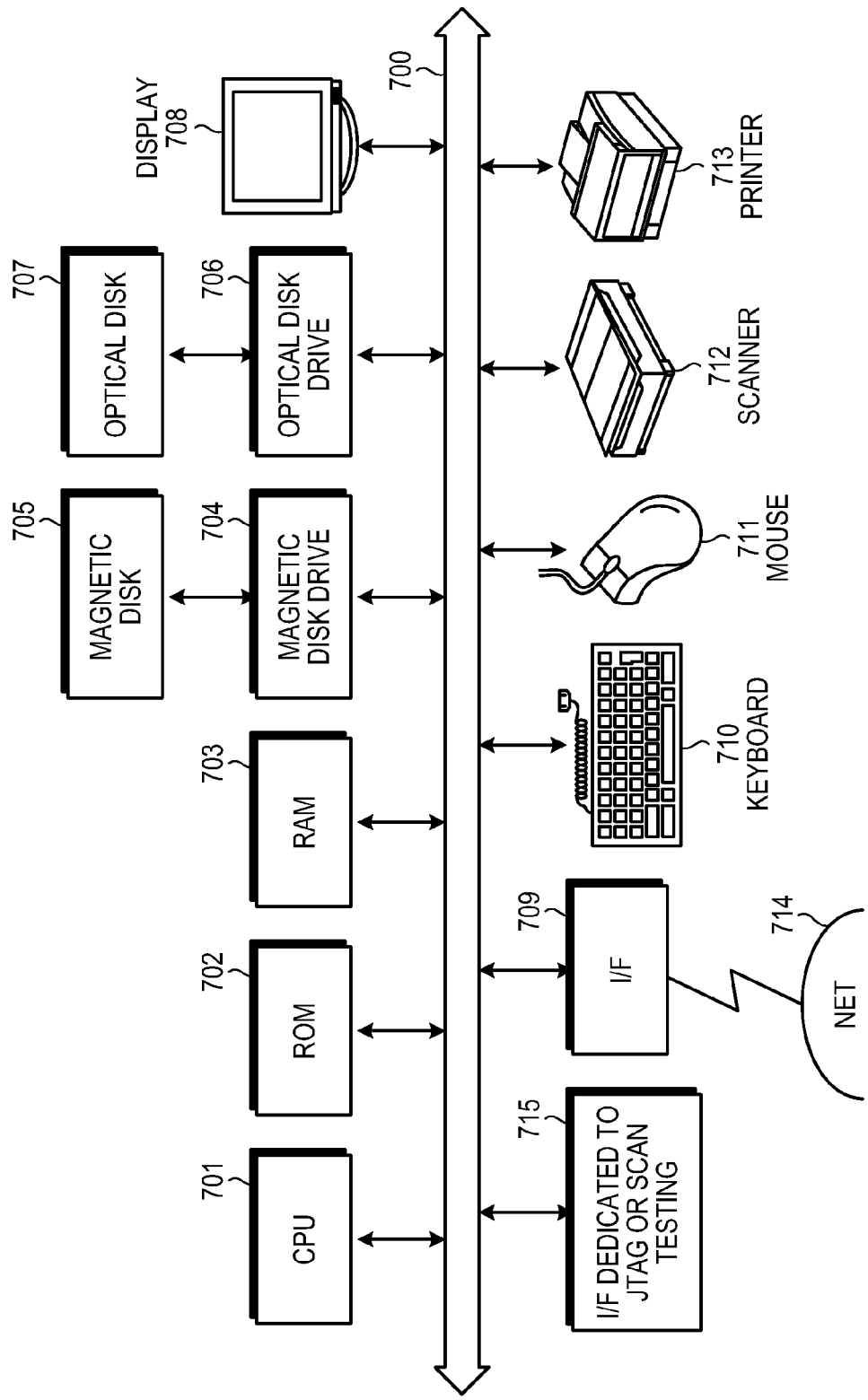

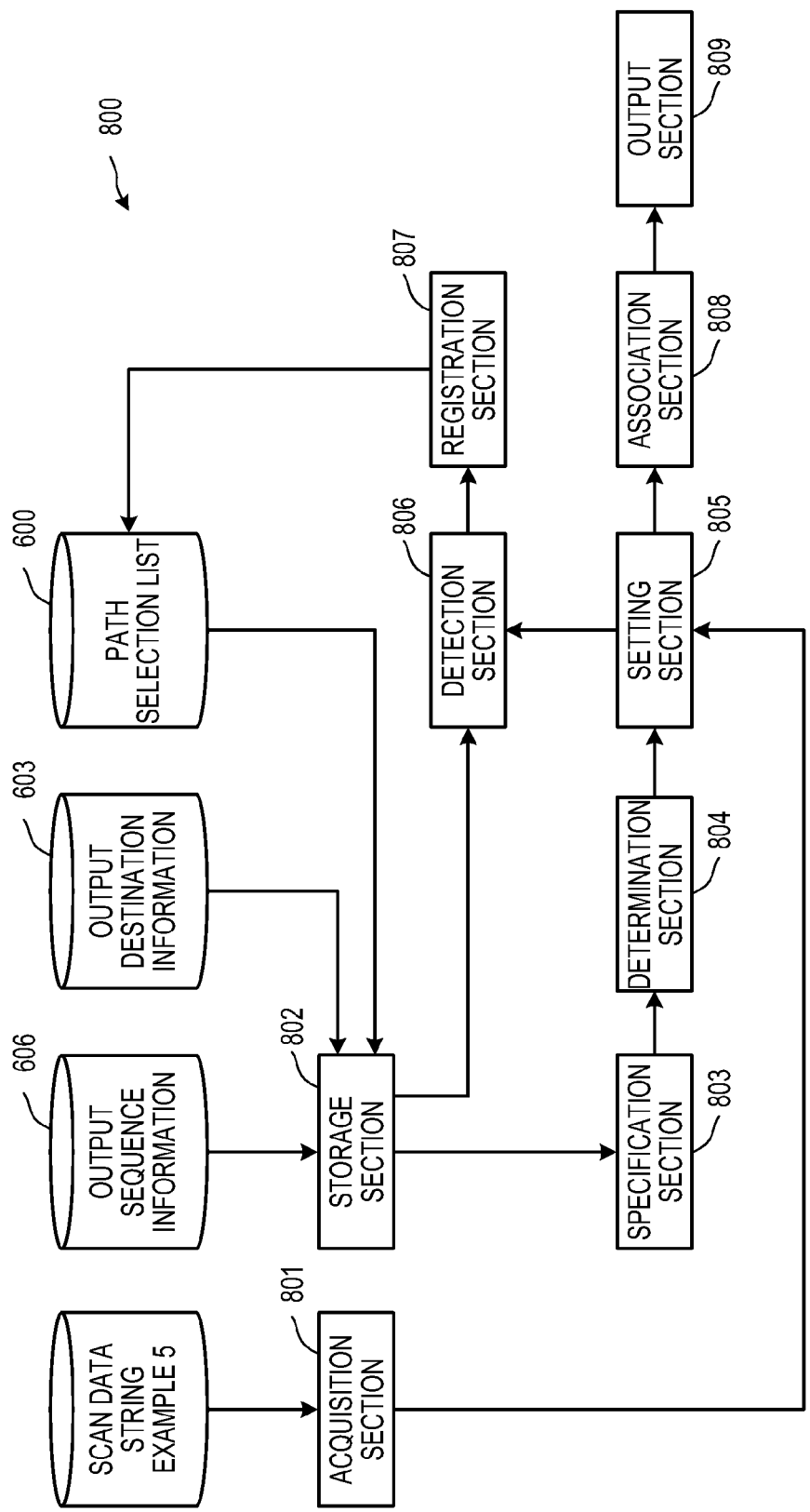

FIG.9

| CIRCUIT MODULE NAME | PATH SELECTION INFORMATION |
|---|---|
| CIRCUIT MODULE N | 1 |
| CIRCUIT MODULE M | 0 |
| CIRCUIT MODULE L | 1 |
| ⋮ | ⋮ |

0: SHORT-CIRCUIT PATH
1: ORDINARY PATH

FIG.10

| CIRCUIT MODULE NAME | CIRCUIT MODULE N | | | | | | CIRCUIT MODULE L | | | | | | | ... |
|---|---|---|---|---|---|---|---|---|---|---|---|---|---|---|
| FF NAME | FF 18 | FF 17 | FF 16 | FF 15 | FF 14 | FF 13 | FF 6 | FF 5 | FF 4 | FF 3 | FF 2 | FF 1 | ... |
| SCAN DATA | 0 | 0 | 1 | 1 | 0 | 1 | 0 | 1 | 0 | 0 | 0 | 1 | ... |

1001 — CIRCUIT MODULE NAME
1002 — FF NAME
1003 — SCAN DATA
1000

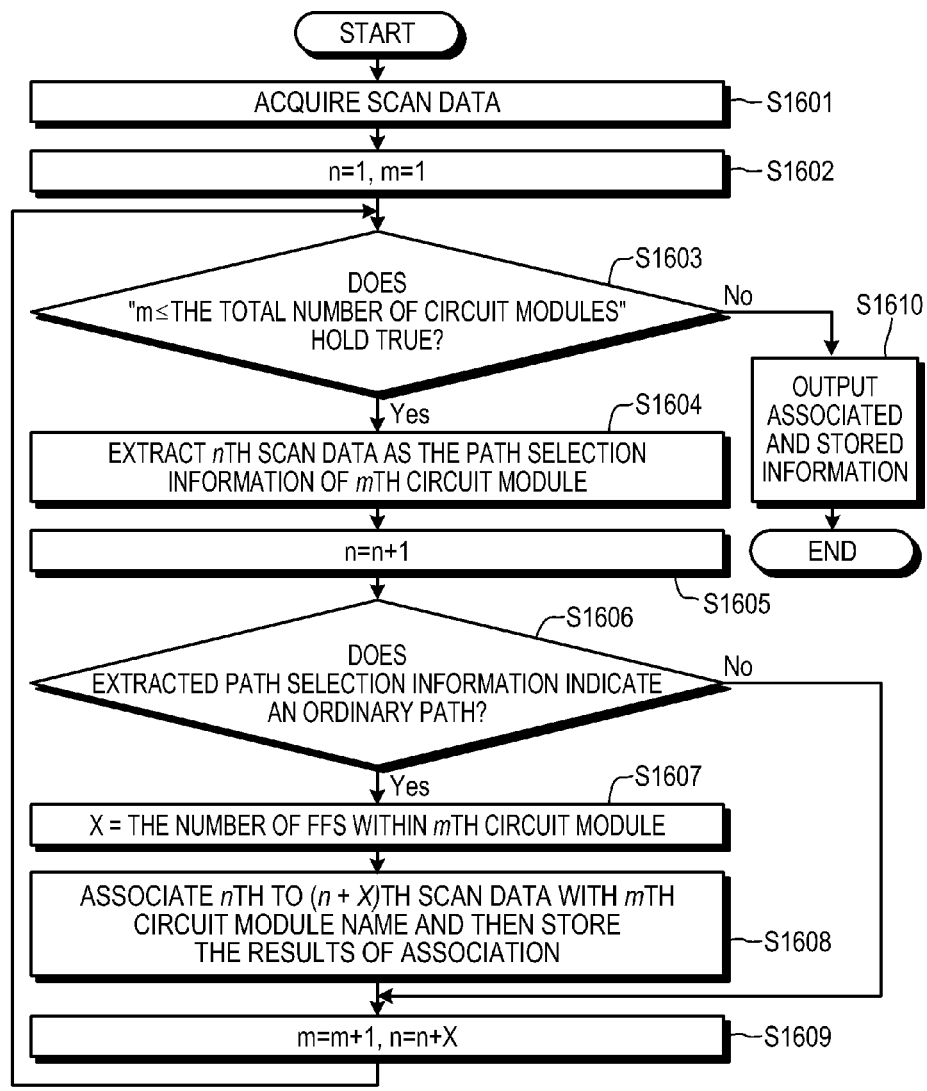

CIRCUIT MODULE, SEMICONDUCTOR INTEGRATED CIRCUIT, AND INSPECTION APPARATUS AND METHOD THEREOF

CROSS-REFERENCE TO RELATED APPLICATIONS

This application is based upon and claims the benefit of priority of the prior Japanese Patent Application No. 2009-072182 filed on Mar. 24, 2009, the entire contents of which are incorporated herein by reference.

BACKGROUND

1. Field

Various embodiments described herein relate to a circuit module used to perform a scan test, a semiconductor integrated circuit, and an inspection apparatus used to inspect scan data and method of implementing same.

2. Description of the Related Art

Typically, as a means for achieving the low power consumption of a semiconductor integrated circuit, there has been known a technique to control a clock signal supplied to data-retaining elements constituting a sequential circuit, such as flip-flops and latches. The technique to control a clock signal is intended to, for example, stop the operation of each circuit module within the semiconductor integrated circuit for which data is not updated according to the operation thereof, by not supplying a clock signal to the circuit module. In the technique to control a clock signal, the clock signal is controlled by a clock gating circuit having at least a control signal and a clock signal as the inputs thereof. The control signal for controlling the supply of the clock signal is generated within the semiconductor integrated circuit.

For example, if the control signal input to the clock gating circuit permits a supply of the clock signal, then the clock gating circuit outputs the clock signal. In contrast, if the control signal does not permit a supply of the clock signal, then the clock gating circuit outputs data fixed to, for example, 0 or 1.

In addition, as a means for achieving the low power consumption of a semiconductor integrated circuit, there has been known a technique to control a power supply voltage (hereinafter referred to as power). The technique to control power is intended to, for example, stop the operation of a circuit module for which data is not updated according to the operation of the semiconductor integrated circuit, by not supplying power to the circuit module. In the technique to control power, power is controlled by a power gating circuit having at least a control signal and power as the inputs thereof. The control signal is generated by a control signal generation circuit within the semiconductor integrated circuit.

Furthermore, as a technique to make easy a test of a semiconductor integrated circuit, there has been a typical scan test. The scan test is a technique to control or observe the interior portion of a semiconductor integrated circuit using only a small number of I/O (Input/Output) terminals external to the semiconductor integrated circuit. In the scan test, data-retaining elements within the semiconductor integrated circuit are replaced with data-retaining elements for scan testing in order to constitute a shift register.

Next, in test mode, a shift register is formed by serially connecting data-retaining elements for scan testing. Thus, there is configured a scan chain whereby the data-retaining elements for scan testing may be controlled or observed from I/O terminals external to the semiconductor integrated circuit.

Still furthermore, as a means for reducing the scan test time of a semiconductor integrated circuit, there has been a typical technique to switch the output of each module including data-retaining elements constituting a scan chain, using a selection circuit (U.S. Pat. No. 2,676,169). A selection is made using the selection circuit, as to whether the output data of a shift register within the module in question is output to other circuit modules or a scan signal is output to other circuit modules without letting the scan signal go through the shift register.

SUMMARY

In accordance with an aspect of embodiments, a circuit module and method thereof is provided. The circuit module includes a shift register constituting part of a scan chain within a semiconductor integrated circuit, a control unit for controlling an operation of the shift register using a control signal generated within the semiconductor integrated circuit, and a selection unit for selecting between a short-circuit path through which a scan signal is loaded and an ordinary path through which the scan signal is loaded after being made to go through the shift register, where the ordinary path is selected when the operation of the shift register is permitted by the control signal and the short-circuit path is selected when the operation of the shift register is not permitted.

The object and advantages of the invention will be realized and attained by means of the elements and combinations particularly pointed out in the claims. It is to be understood that both the foregoing general description and the following detailed description are exemplary and explanatory and are not restrictive of the various embodiments, as claimed.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIG. 2B is an explanatory drawing illustrating examples of scan data strings output from a semiconductor integrated circuit;

FIG. 4B is an explanatory drawing illustrating examples of scan data strings output from a semiconductor integrated circuit;

FIG. 6A is an explanatory drawing showing path selection information indicating which path each circuit module has selected;

FIG. 6B is an explanatory drawing showing circuit modules which are output destinations of FFs included in a shift register;

FIG. 7 is a block diagram illustrating a hardware configuration of an inspection apparatus in accordance with an embodiment;

FIG. 8 is a block diagram illustrating a functional configuration of an inspection apparatus in accordance with an embodiment;

FIG. 9 is an explanatory drawing illustrating a registered path selection list;

FIG. 10 is an explanatory drawing illustrating one example of output provided by an inspection apparatus;

FIG. 16 is a flowchart showing an inspection processing procedure of an inspection apparatus in accordance with an embodiment.

DETAILED DESCRIPTION OF EMBODIMENTS

Figure 1A:
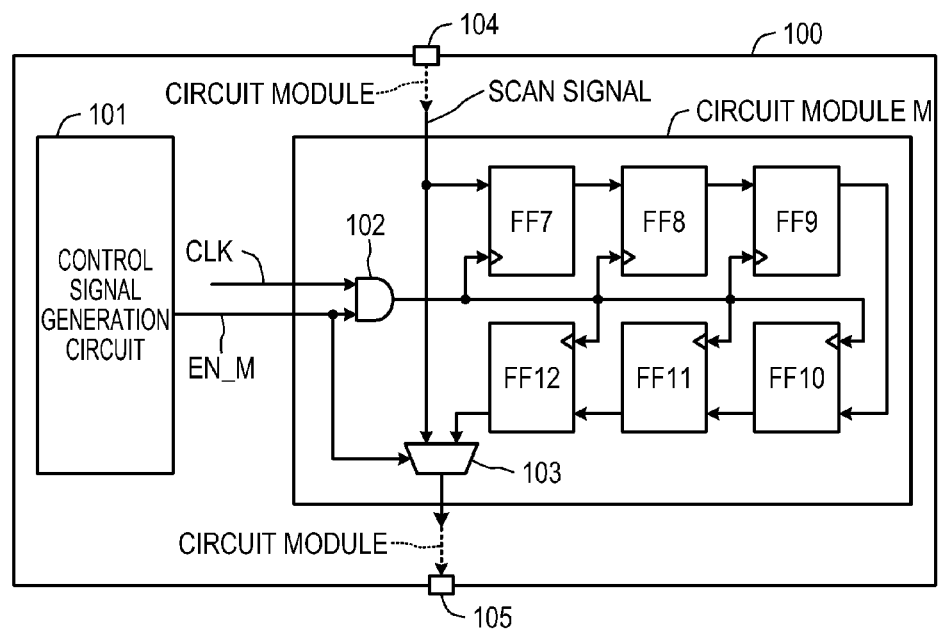
FIG. 1A is an explanatory drawing illustrating a semiconductor integrated circuit and a circuit module in accordance with an embodiment.

Reference will now be made in detail to the embodiments, examples of which are illustrated in the accompanying drawings, wherein like reference numerals refer to the like elements throughout. The embodiments are described below to explain the present invention by referring to the figures.

At a time of scan-testing a semiconductor integrated circuit, circuit modules including data-retaining elements constituting a scan chain are all connected to one another and, therefore, must always be brought into operation. Accordingly, at the time of scan-testing a semiconductor integrated circuit including a clock/power gating circuit for controlling the above-described operation, modules are enabled irrespective of control by the clock/power gating circuit. Thus, there is the problem that extra labor is required in a scan test.

Another problem is that it is unknown what scan data is output in a shift register within a circuit module which need not be enabled depending on a type of scan test. Therefore, a designer needs to ascertain what data is going to be output. Thus, there has been the problem that a scan test is difficult to perform. In addition, there is the need to ascertain, for example, whether the scan data of other circuit modules constituting the scan chain is affected by any unneeded circuit modules. Thus, there is the problem that debugging is difficult to perform.

Furthermore, in a technique to switch the output of each circuit module using a selection circuit, there has been the problem that in the case of a semiconductor integrated circuit including a gating circuit for controlling operation, there arises such extra labor as performing control from the outside on the basis of information provided by a control signal input to the gating circuit. In addition, a designer must ascertain whether the control signal is input from an input terminal with a precise timing. Thus, there is the problem that a scan test is difficult to perform.

Furthermore, the technique to switch the output of each circuit module using a selection circuit requires an input terminal for inputting a control signal to each circuit module. Thus, there is the problem that shortage occurs in input terminals for inputting the control signal.

In order to solve the above-described and other problems involved in the related art, examples of the present disclosed technique are intended to provide a circuit module, a semiconductor integrated circuit, and an inspection apparatus capable of promoting the efficiency of a scan test and reducing a test time by diverting an operation-controlling control signal generated within the semiconductor integrated circuit.

Hereinafter, preferred embodiments of a circuit module, a semiconductor integrated circuit and an inspection apparatus in accordance with the present disclosed technique will be described in detail with reference to the accompanying drawings. In the present embodiment, an explanation will be made by using a circuit module in which a path is selected by a control signal for controlling a supply of a clock signal to a shift register. Note that no explanation will be made of the way a path is selected by a control signal for controlling a supply of power to the shift register.

Figure 1B:
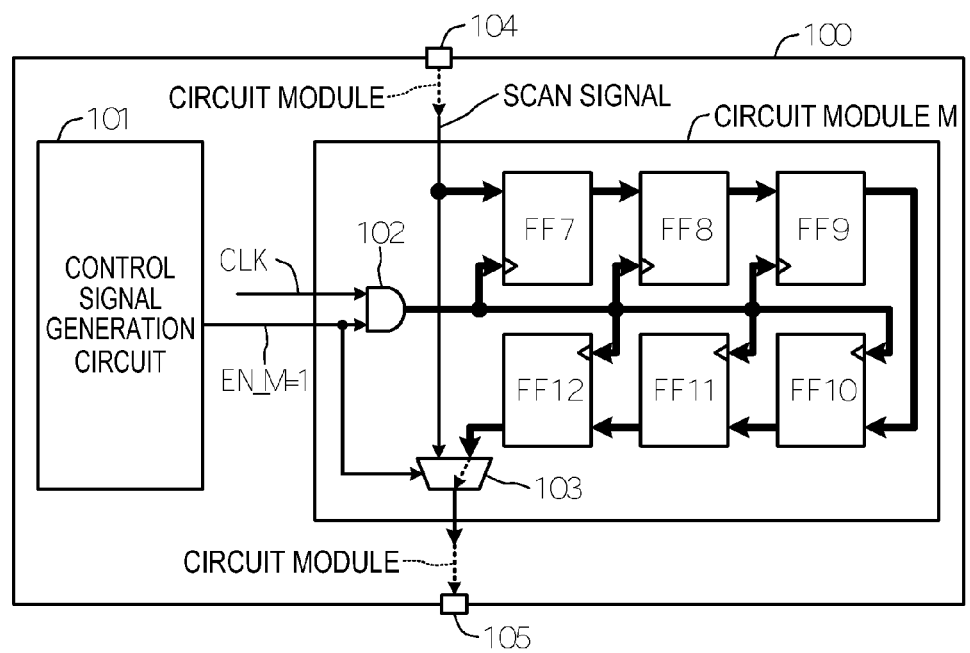
FIG. 1B is an explanatory drawing illustrating an ordinary path.
Figure 1C:
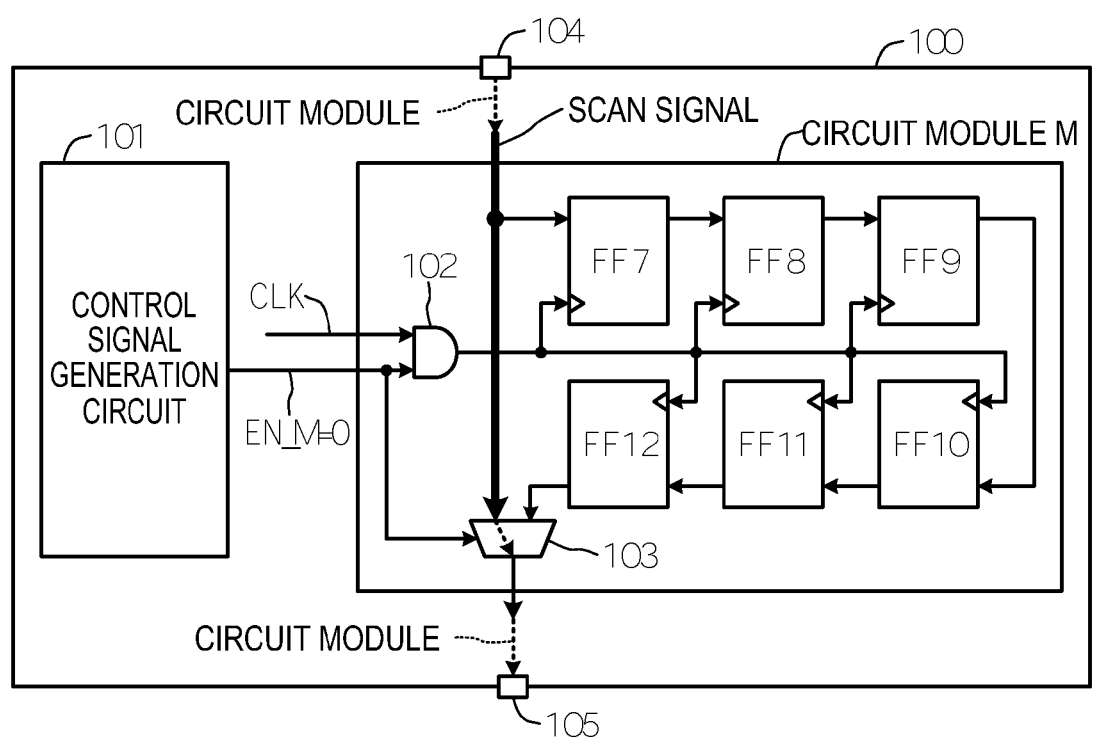
FIG. 1C is an explanatory drawing illustrating a short-circuit path.

In an embodiment, either a short-circuit path for loading a scan signal or an ordinary path for loading the scan signal by letting the scan signal go through the shift register is selected on the basis of a control signal for controlling the operation of the shift register. Consequently, by diverting the control signal generated within the semiconductor integrated circuit, it is possible to promote the efficiency of a scan test. It is also possible to reduce a scan test time. FIGS. 1A to 1C illustrate the semiconductor integrated circuit and the circuit module in accordance with an embodiment.

FIG. 1A is an explanatory drawing illustrating a semiconductor integrated circuit and a circuit module in accordance with an embodiment. A semiconductor integrated circuit 100 is comprised of a circuit module M constituting a scan chain, a plurality of circuit modules (dotted arrows indicate that the plurality of circuit modules is included) constituting the scan chain, a control signal generation circuit 101, an input terminal 104, and an output terminal 105. Note that the direction of arrows indicates the direction of data flow.

In the present embodiment, the control signal generation circuit 101 generates a control signal for controlling whether or not to supply a clock signal. Note that, as described above, an explanation will be made by taking a clock gating circuit as an example in the present embodiment, and an explanation in which a power gating circuit is taken as an example will not be made. A control signal of the circuit module M for controlling whether or not to supply the clock signal is denoted by EN_M.

The circuit module M is comprised of a clock gating circuit 102, FFs (Flip-Flops) 7 to 12, and a selection circuit 103. In the present embodiment, an explanation will be made by using the FFs as data-retaining elements. The FFs 7 to 12 form a shift register constituting part of the scan chain within the semiconductor integrated circuit. A scan signal is shifted in synchronization with the clock signal from the FF7 to the FF8, from the FF8 to the FF9, and so on.

Signals EN_M and CLK are input to the clock gating circuit 102. The reference character CLK denotes the clock signal. If the control signal EN_M is 0, then the clock gating circuit 102 does not supply the clock signal to the FFs 7 TO 12. If the control signal EN_M is 1, then the clock gating circuit 102 supplies the clock signal to the FFs 7 to 12. Accordingly, the state of the control signal EN_M being 0 means that the operation of the shift register is not permitted. In contrast, the state of the control signal EN_M being 1 means that the operation of the shift register is permitted.

Next, the control signal EN_M, the scan signal and the output data of the FF 12 are input to the selection circuit 103. If the control signal EN_M is 0, then the selection circuit 103 selects a path through which the scan signal is output. If the control signal EN_M is 1, then the selection circuit 103 selects a path through which the output data of the FF 12 is output. The former path is referred to as a short-circuit path and the latter path is referred to as an ordinary path. An ordinary path will be illustrated using FIG. 1B and a short-circuit path will be illustrated using FIG. 1C.

FIG. 1B is an explanatory drawing illustrating an ordinary path. If the control signal EN_M is 1, then an ordinary path is selected by the selection circuit 103. In the ordinary path, the clock signal is supplied to the shift register. Accordingly, the scan signal input to the circuit module M goes through the shift register (denoted by thick-line arrows). The output data of the FF 12 is selected by the selection circuit 103 and is output from the circuit module M. Next, the short-circuit path will be illustrated using FIG. 1C.

FIG. 1C is an explanatory drawing illustrating a short-circuit path. If the control signal EN_M is 0, then the short-circuit path is selected by the selection circuit 103. In the short-circuit path, the clock signal is not supplied to the shift register. Accordingly, the scan signal input to the circuit module M is selected by the selection circuit 103 without being made to go through the shift register, and is output from the circuit module M. Next, a plurality of circuit modules constituting the scan chain will be illustrated using FIGS. 2A and 2B.

Figure 2A:
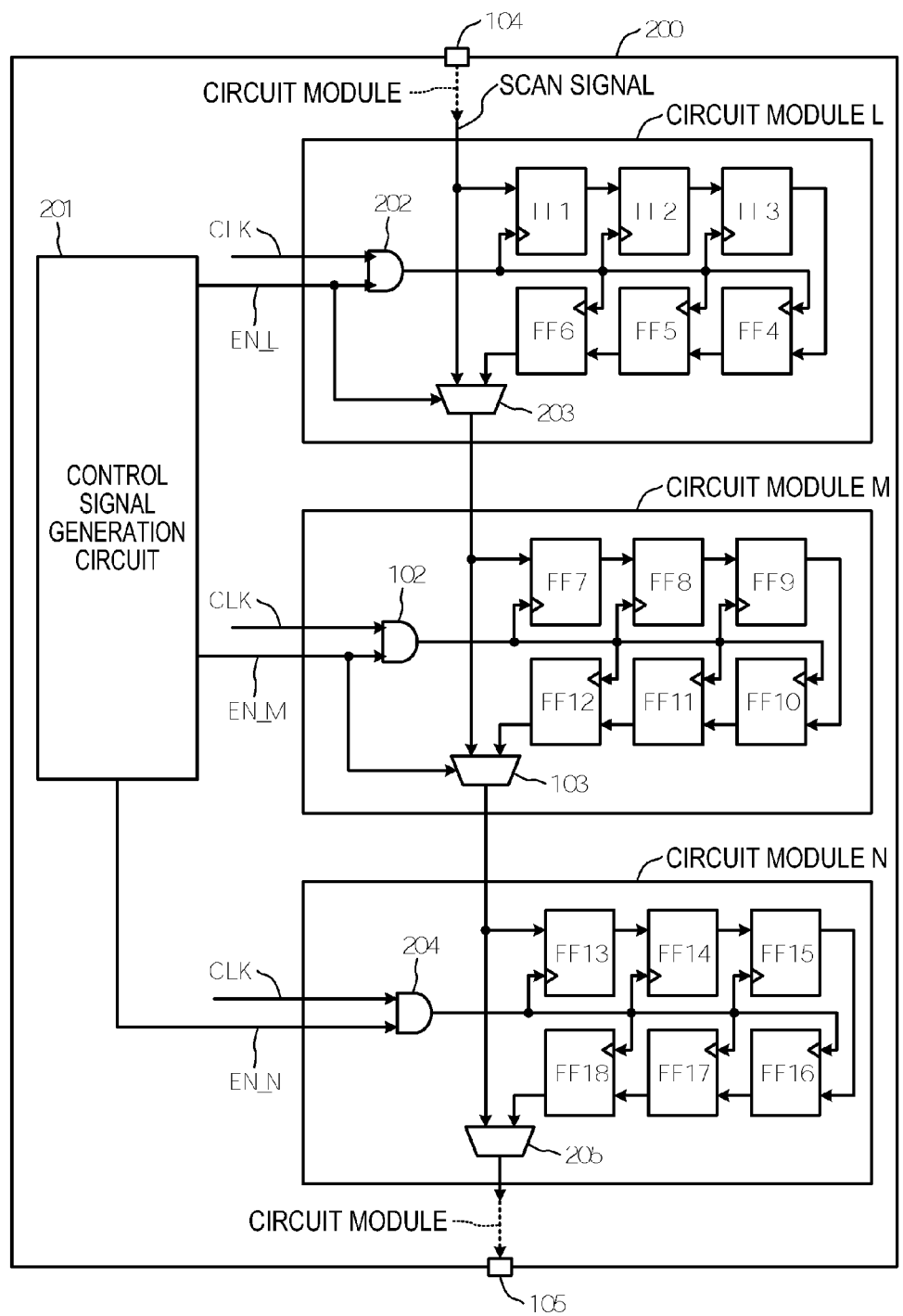
FIG. 2A is an explanatory drawing illustrating a plurality of circuit modules constituting a scan chain.

FIG. 2A is an explanatory drawing illustrating a plurality of circuit modules constituting a scan chain. A semiconductor integrated circuit 200 is comprised of a circuit module L, a circuit module M, a circuit module N, a plurality of other circuit modules (dotted-line arrows indicate that a plurality of circuit modules is included), a control signal generation circuit 201, an input terminal 104, and an output terminal 105. The circuit module M within the semiconductor integrated circuit 200 is the same in configuration as the circuit module M within the semiconductor integrated circuit 100.

The circuit module L is comprised of a clock gating circuit 202, a selection circuit 203, and FFs 1 to 6. The FFs 1 to 6 form a shift register constituting part of a scan chain within the semiconductor integrated circuit 200. A control signal for controlling the operation of the shift register within the circuit module L is denoted by EN_L.

The circuit module N is comprised of a clock gating circuit 204, a selection circuit 205, and FFs 13 to 18. The FFs 13 to 18 form a shift register constituting part of the scan chain within the semiconductor integrated circuit 200. A control signal for controlling the operation of the shift register within the circuit module N is denoted by EN_N. An example of a scan data string output from the output terminal 105 will be illustrated using FIG. 2B.

FIG. 2B is an explanatory drawing illustrating an example of a scan data string output from the semiconductor integrated circuit 200. A scan data string example 1 shows part of a scan data string output from the output terminal 105 when the control signal EN_L is 1, the control signal EN_M is 1, and the control signal EN_N is 1. If the control signal EN_L is 1, the control signal EN_M is 1, and the control signal EN_N is 1, then the selection circuit 205 within the circuit module N, the selection circuit 103 within the circuit module M, and the selection circuit 203 within the circuit module L select an ordinary path. Accordingly, in the scan data string example 1, the scan data string of the circuit module N, the scan data string of the circuit module M, and the scan data string of the circuit module L are arrayed in the named order in the direction of an arrow (indicating an output sequence).

A scan data string example 2 shows part of a scan data string output from the output terminal 105 when the control signal EN_L is 1, the control signal EN_M is 0, and the control signal EN_N is 1. If the control signal EN_L is 1, the control signal EN_M is 0, and the control signal EN_N is 1, then the selection circuit 205 within the circuit module N and the selection circuit 203 within the circuit module L select an ordinary path, whereas the selection circuit 103 within the circuit module M selects a short-circuit path. Accordingly, in the scan data string example 2, the scan data string of the circuit module N and the scan data string of the circuit module L are arrayed in the named order in the direction of an arrow (indicating an output sequence).

Consequently, by diverting the control signal for controlling the operation of circuit modules for use as a control signal for selecting a path, it is possible to promote the efficiency of a scan test. In addition, it is possible to shorten scan data and thereby reduce a test time.

In an embodiment to be described next, a circuit module includes a retaining circuit which retains a value of a control signal if a scan operation signal for controlling the operation of a scan test does not permit the scan test. In contrast, the retaining circuit outputs the value of the control signal to a selection circuit if the scan operation signal permits the scan test. Consequently, the control signal input to the selection circuit during the scan test does not change. Note that constituent elements identical to those explained in the above-described embodiment are denoted by like reference numerals and characters and will not be explained again. Circuit modules including retaining circuits will be illustrated using FIG. 3.

Figure 3:
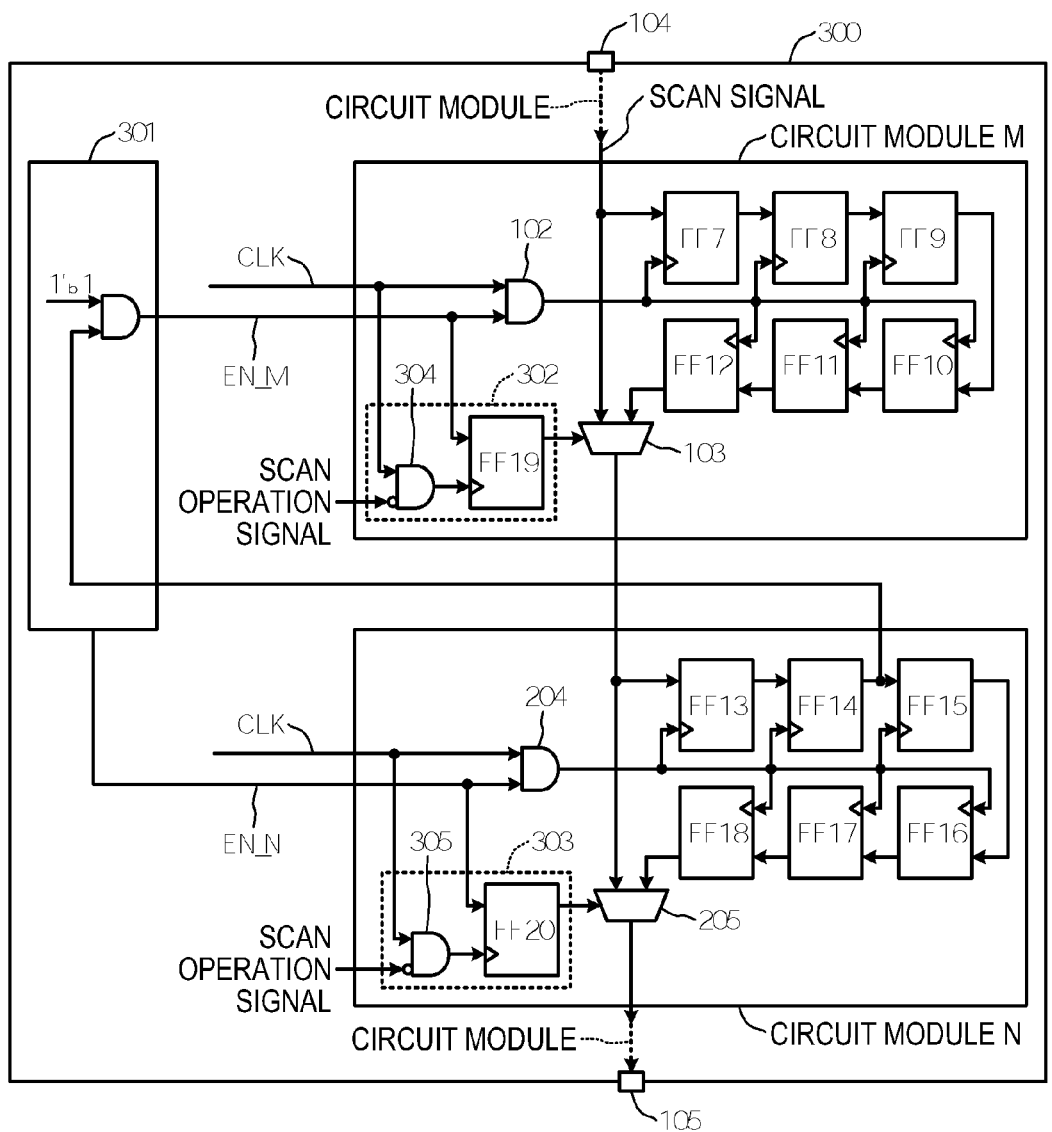
FIG. 3 is an explanatory drawing illustrating circuit modules including retaining circuits.

FIG. 3 is an explanatory drawing illustrating circuit modules including retaining circuits. A semiconductor integrated circuit 300 is comprised of a control signal generation circuit 301, a circuit module M, a circuit module N, a plurality of other circuit modules (dotted-line arrows indicate that a plurality of circuit modules is included), an input terminal 104, and an output terminal 105.

The circuit module M is comprised of FFs 7 to 12, a clock gating circuit 102, a selection circuit 103, and a retaining circuit 302. The circuit module N is comprised of FFs 13 to 18, a clock gating circuit 204, a selection circuit 205, and a retaining circuit 303. The state of a control signal EN_M for controlling the operation of a shift register within the circuit module M is determined by the output data of the FF 14 within the circuit module N. Consequently, if a scan test is in progress, the output data of the FF 14 changes due to the shift operation of the scan chain. Therefore, if the control signal EN_M is input to the selection circuit 103, a short-circuit path and an ordinary path switch to each other during a scan test, according to a scan signal.

As the result that the value of the control signal EN_M in a state of the scan test being not in progress is retained and that the retained value of the control signal EN_M is input to the selection circuit 103 in a state of the scan test being in progress, it is possible to prevent a path from being switched unnecessarily. The value of the control signal EN_M is retained by the retaining circuit 302.

The retaining circuit 302 is comprised of, for example, a two-input AND circuit 304 and an FF 19. A clock signal CLK and a scan operation signal are input to the AND circuit 304. The operation of a scan test is controlled by the scan operation signal. For example, if the scan operation signal is 1, then the operation of the scan test is permitted and a scan chain is configured. Thus, a scan test is carried out when the clock signal is input. If the scan operation signal is 0, then the operation of the scan test is not permitted and, therefore, the scan chain is not configured.

Going back to the explanation of the retaining circuit 302, if the scan operation signal is 0, then the AND circuit 304 supplies a clock signal to the FF 19. If the scan operation signal is 1, then the AND circuit 304 does not supply the clock signal to the FF 19. Consequently, the FF 19 retains the value of the control signal EN_M if the scan operation signal is 0. The FF 19 does not retain the value of the control signal EN_M, however, if the scan operation signal is 1. The retaining circuit 303 is comprised of a two-input AND circuit 305 and an FF 20. The retaining circuit 303 is the same in configuration as the retaining circuit 302.

Consequently, if the scan operation signal does not permit scan operation, then the value of a control signal is retained by the retaining circuit. If the scan operation signal permits scan operation, then the value of the control signal retained by the retaining circuit is output to the selection circuit. Accordingly, a path is fixed during the scan test, thereby making it possible to promote the efficiency of the scan test.

In an embodiment to be described next, the circuit modules explained in the above embodiment(s) include an appending circuit for adding path selection information indicating which path, between a short-circuit path and an ordinary path, has been selected by a selection circuit. Consequently, it is possible to make debugging easy. Note that constituent elements identical to those explained in the above embodiment(s) are denoted by like reference numerals and characters and will not be explained again. A circuit module including an appending circuit will be illustrated using FIGS. 4A and 4B.

Figure 4A:
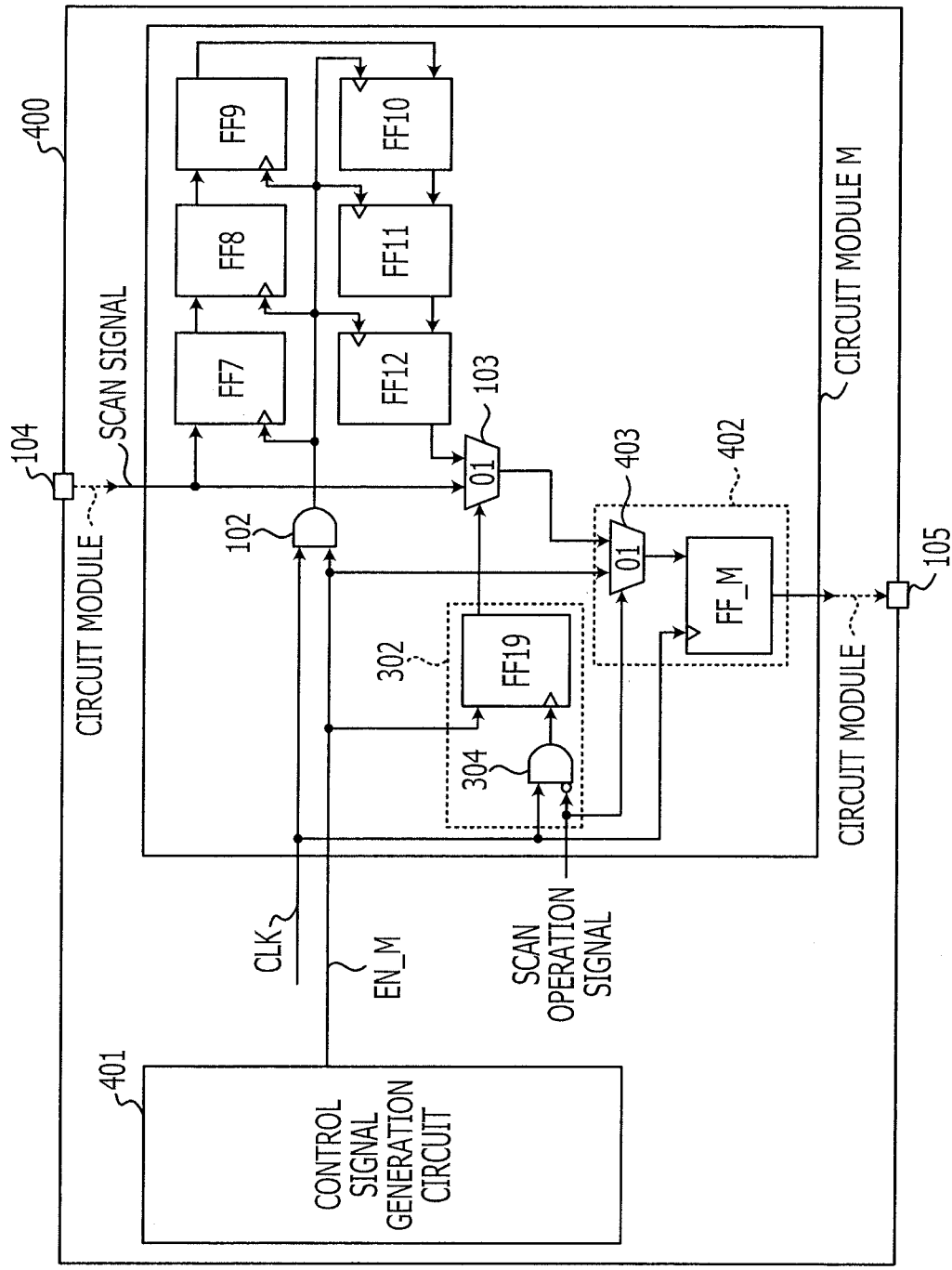
FIG. 4A is an explanatory drawing illustrating a circuit module including an appending circuit.

FIG. 4A is an explanatory drawing illustrating a circuit module including an appending circuit. A semiconductor integrated circuit 400 is comprised of a circuit module M, a plurality of other circuit modules (dotted-line arrows indicate that a plurality of circuit modules is included), a control signal generation circuit 401, an input terminal 104, and an output terminal 105. The circuit module M is comprised of FFs 7 to 12, a clock gating circuit 102, a selection circuit 103, a retaining circuit 302, and an appending circuit 402.

The appending circuit 402 adds selection information indicating which path, between an ordinary path and a short-circuit path, has been selected to the head of the scan data string of the circuit module M, and outputs the scan data string. The appending circuit 402 is comprised of an FF_M and a selection circuit 403. The selection circuit 403 selects the output data of the selection circuit 103 or the value of a control signal EN_M according to a scan operation signal.

If the scan operation signal is 0 (i.e., if a scan test is not permitted), then the selection circuit 403 selects the value of the control signal EN_M. If the scan operation signal is 1 (i.e., if a scan test is permitted), then the selection circuit 403 selects the output data of the selection circuit 103. The data selected by the selection circuit 403 is retained by the FF_M in synchronization with a clock signal CLK and is output from the circuit module M.

If the scan operation signal is 0, then the value of the control signal EN_M is retained by the FF_M and thereby the value of control signal EN_M is appended to the head of the scan signal from the selection circuit 103. Scan data which is the first data item of a scan data string within each circuit module output from the output terminal 105 is referred to as path selection information. The scan data string output from the output terminal 105 will be illustrated using FIG. 4B.

FIG. 4B is an explanatory drawing illustrating an example of the scan data string output from the semiconductor integrated circuit 400. Assume that the semiconductor integrated circuit 400 is configured so as to further include a circuit module N and a circuit module L. Also assume that each circuit module includes an appending circuit. A scan data string example 3 shows part of the scan data string output from the output terminal 105. The path selection information of the circuit module N has a value of 1. Therefore, an ordinary path is selected by the selection circuit 205 within the circuit module N.

The path selection information of the circuit module M has a value of 1. Therefore, an ordinary path is selected by the selection circuit 103 within the circuit module M. The path selection information of the circuit module L has a value of 1. Therefore, an ordinary path is selected by the selection circuit 203 within the circuit module L. The scan data string example 3 includes the scan data string of the circuit module N, the scan data string of the circuit module M, and the scan data string of the circuit module L.

Next, a scan data string example 4 shows part of a scan data string output from the output terminal 105. The path selection information of the circuit module N has a value of 1. Therefore, an ordinary path is selected by the selection circuit 205 within the circuit module N.

The path selection information of the circuit module M has a value of 0. Therefore, a short-circuit path is selected by the selection circuit 103 within the circuit module M. The path selection information of the circuit module L has a value of 1. Therefore, an ordinary path is selected by the selection circuit 203 within the circuit module L. The scan data string example 4 includes the scan data string of the circuit module N and the scan data string of the circuit module L. Consequently, by observing the value of scan data, a user (designer or inspector) may determine which path each circuit module has selected. Accordingly, it is possible to promote the efficiency of a scan test. In addition, it is possible to make debugging easy.

In an embodiment to be described next, a scan data string output from a semiconductor integrated circuit is acquired to register the path selection information of circuit modules whose path selection information is unknown, according to the scan data string. Then, scan data strings corresponding to respective circuit modules and the identification information of the circuit modules are associated with one another and then output. Consequently, debugging may be made easy. A control signal generation circuit within a semiconductor integrated circuit under inspection supplies the output data of an FF included in a shift register within a circuit module, as a control signal, to other circuit modules the output data of which is output later than that of the former circuit module. Note that constituent elements identical to those explained in the above embodiment(s) are denoted by like reference numerals and characters and will not be explained again.

Figure 5:
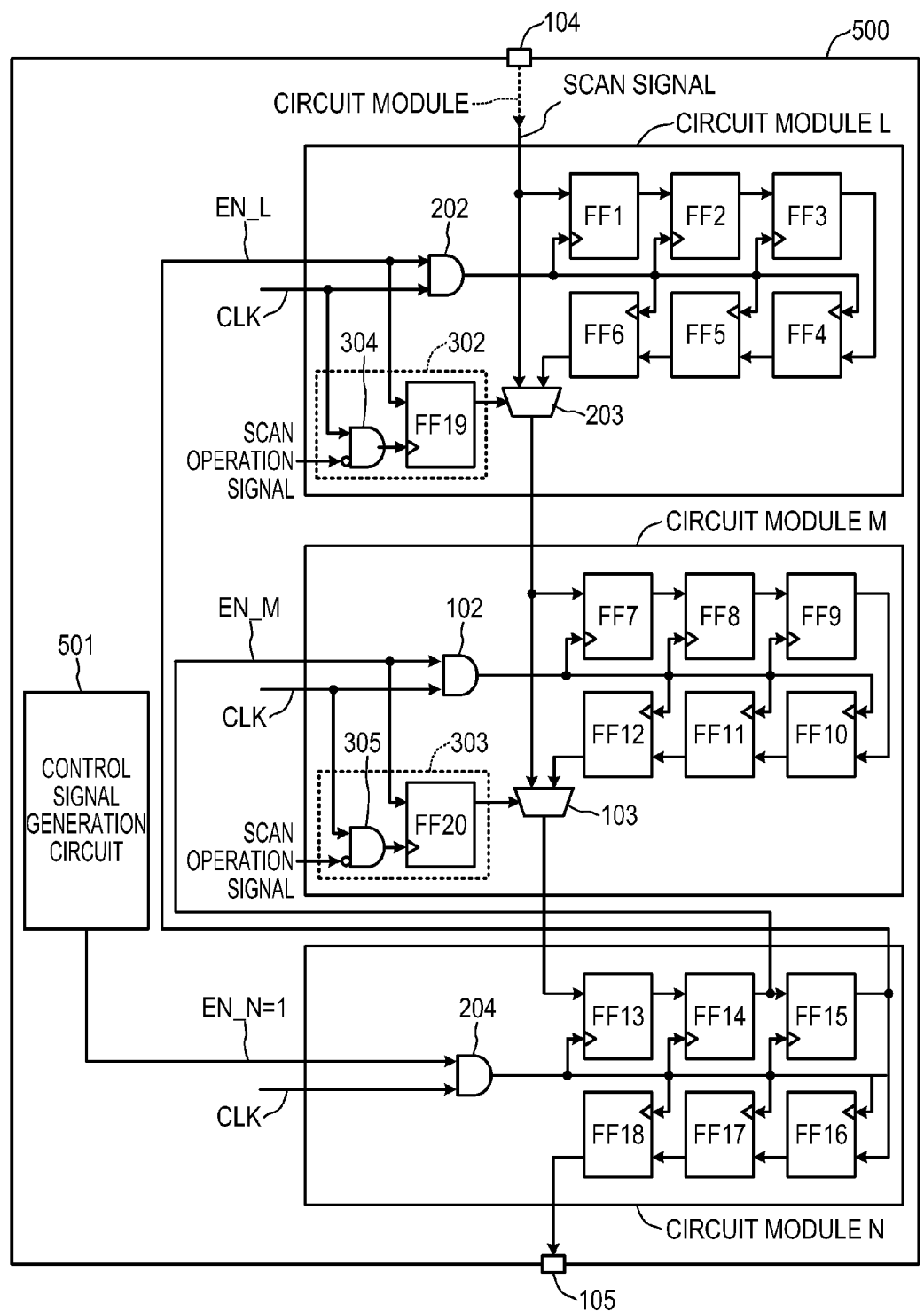
FIG. 5 is an explanatory drawing illustrating a semiconductor integrated circuit targeted by an inspection apparatus of an embodiment.

FIG. 5 is an explanatory drawing illustrating a semiconductor integrated circuit targeted by the inspection apparatus of the above described embodiment. A semiconductor integrated circuit 500 is comprised of a circuit module L constituting a scan chain, a circuit module M constituting the scan chain, a circuit module N constituting the scan chain, a plurality of other circuit modules constituting the scan chain, (dotted-line arrows indicate that a plurality of circuit modules is included), a control signal generation circuit 501, an input terminal 104, and an output terminal 105.

The circuit module N lets a scan signal go through a shift register and be output to the output terminal 105. The output data of an FF 14 included in the shift register of the circuit module N is supplied to the circuit module M as a control signal. The output data of an FF 15 included in the shift register of the circuit module N is supplied to the circuit module L as a control signal.

FIG. 6A is an explanatory drawing showing path selection information indicating which path each circuit module has selected. A path selection list 600 is comprised of a circuit module name 601 and path selection information 602. A value 1 of the path selection information 602 shows that an ordinary path is selected. In contrast, a value of 0 indicates that a short-circuit path is selected. For example, if the circuit module name 601 is the circuit module N, then the path selection information 602 has a value of 1. It is therefore known that an ordinary path is selected in the circuit module N.

In the case of a circuit module supplied with a control signal from another circuit module constituting a scan chain, the path selection information 602 is unknown and therefore a value of 1 is set in the path selection information 602. Consequently, the unknown path selection information 602 is registered by checking the scan data string. Note that the path selection list 600 is stored in a memory unit or in the memory unit of an accessible external computer.

FIG. 6B is an explanatory drawing showing circuit modules which are the output destinations of FFs included in shift registers. Output destination information 603 is comprised of an FF name 604 and a circuit module name 605. The output data of an FF is supplied as a control signal to a circuit module which is subsequent in the order of output to a circuit module including the FF. For example, the output destination of the FF 14 is the circuit module M. Note that the output destination information 603 is stored in a memory unit or in the memory unit of an accessible external computer.

Figure 6C:
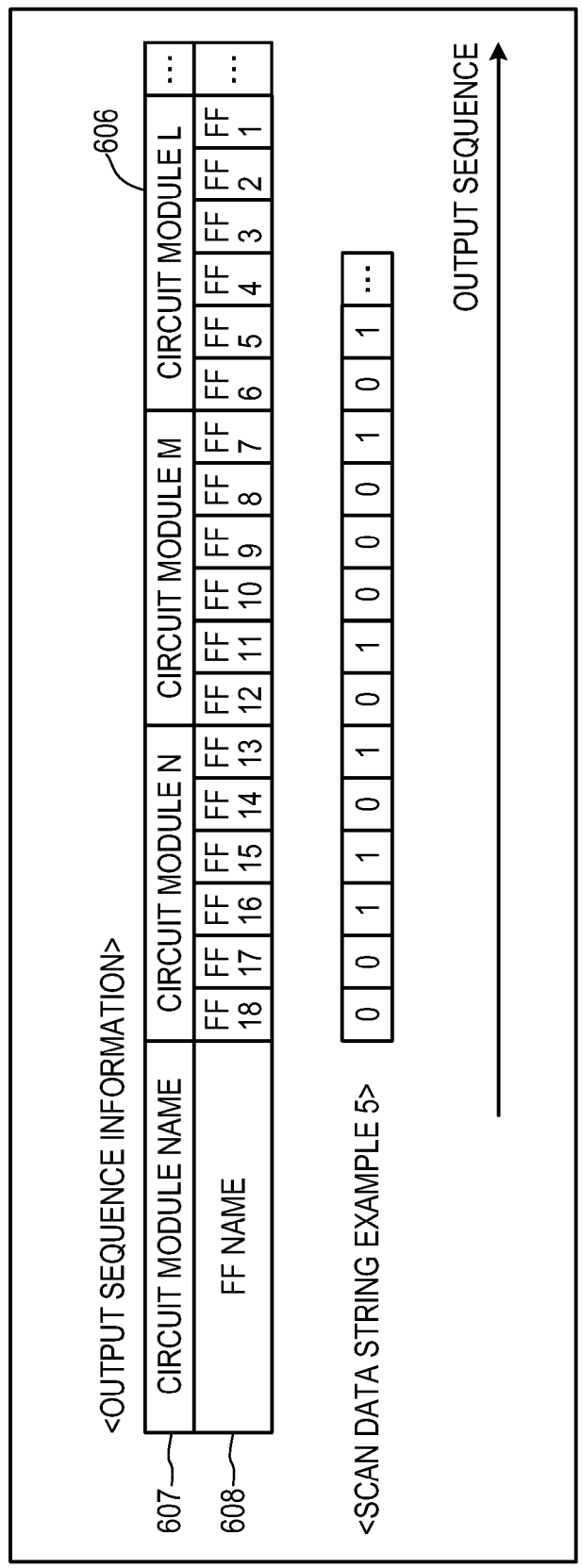
FIG. 6C is an explanatory drawing illustrating an example of output sequence information and an example of a scan data string in accordance with an embodiment.

FIG. 6C is an explanatory drawing illustrating an example of output sequence information and an example of a scan data string in accordance with the above-described embodiment. Output sequence information 606 is information indicating the output sequence of data-retaining elements included in the shift registers of circuit modules within the semiconductor integrated circuit 500 which constitute a scan test. The output sequence information 606 is comprised of a circuit module name 607 and an FF name 608. The direction of an arrow shows an output sequence.

Note that the output sequence information 606 is stored in a memory unit or in the memory unit of an accessible external computer. A scan data string example 5 shows one example of a scan data string output from the semiconductor integrated circuit 500.

FIG. 7 is a block diagram illustrating the hardware configuration of an inspection apparatus in accordance with an embodiment. In FIG. 7, the inspection apparatus includes a CPU (Central Processing Unit) 701, a ROM (Read-Only Memory) 702, a RAM (Random Access Memory) 703, a magnetic disk drive 704, a magnetic disk 705, an optical disk drive 706, an optical disk 707, a display 708, an I/F (Interface) 709, a keyboard 710, a mouse 711, a scanner 712, a printer 713, and an I/F 715 dedicated to JTAG or scan testing. In addition, the respective components are connected to one another through a bus 700.

Here, the CPU 701 governs the control of the inspection apparatus as a whole. The ROM 702 stores programs, such as a boot program. The RAM 703 is used as a work area of the CPU 701. The magnetic disk drive 704 controls data read/write operation on the data magnetic disk 705 according to control by the CPU 701. The magnetic disk 705 stores data written by the control of the magnetic disk drive 704.

The optical disk drive 706 controls data read/write operation on the optical disk 707 according to control by the CPU 701. The optical disk 707, for example, stores data written according to control by the optical disk drive 706 and makes data stored in the optical disk 707 read by a computer.

The display 708 displays a cursor and icons or toolboxes, as well as documents, images, and data such as function information. For this display 708, it is possible to adopt, for example, a CRT, a TFT liquid crystal display, or a plasma display.

The interface 709 is connected to a network 714, such as a LAN (Local Area Network), a WAN (Wide Area Network) or the Internet, through a communications line, and is further connected to other equipment through this network 714. The I/F 709 governs an interface between the network 714 and the internal network of the inspection apparatus, and controls the input/output of data from external equipment. For the I/F 709, it is possible to adopt, for example, a modem or a LAN adapter.

The I/F 715 dedicated to JTAG or scan testing acquires a scan data string output from the output terminal of the semiconductor integrated circuit. Alternatively, a scan signal may be input from the input terminal of the semiconductor integrated circuit using the I/F 715 dedicated to JTAG or scan testing.

The keyboard 710 includes keys for inputting letters, numerals, various commands and the like, whereby data input is performed. A touch-panel input pad, a tenkey numeric keypad, or the like may be used instead. The mouse 711 is used to, for example, move the cursor, select a range, and move or resize windows. A trackball, a joystick or the like may be used instead, if as a pointing device, the trackball, the joystick or the like has the same functions as the mouse.

The scanner 712 optically reads images and loads them into the inspection apparatus. Note that the scanner 712 may have an Optical Character Reader (OCR) function. The printer 713 prints image data and document data. For the printer 713, it is possible to adopt, for example, a laser printer or an ink-jet printer.

Next, an explanation will be made of the functional configuration of an inspection apparatus. FIG. 8 is a block diagram illustrating the functional configuration of an inspection apparatus in accordance with an embodiment. An inspection apparatus 800 is comprised of an acquisition section 801, a storage section 802, a specification section 803, a determination section 804, a setting section 805, a detection section 806, a registration section 807, an association section 808, and an output section 809. Specifically, functions (acquisition section 801 to output section 809) which serve as a control section of the inspection apparatus 800 are realized by, for example, letting a program stored in a memory unit, such as the ROM 702, the RAM 703, the magnetic disk 705 or the optical disk 707 illustrated in FIG. 7 be executed by the CPU 701, or by using the I/F 709.

First, the acquisition section 801 acquires a scan data string output from the output terminal of a semiconductor integrated circuit. Specifically, for example, the CPU 701 acquires the scan data string example 5 output from the output terminal 105 of the semiconductor integrated circuit 500 through the I/F 715 dedicated to JTAG or scan testing. Note that the acquired scan data string example 5 is stored in a memory unit, such as the RAM 703, the magnetic disk 705, or the optical disk 707.

The storage section 802 stores the output sequence of circuit modules, output sequence information indicating the output sequence of FFs of each circuit module, and output destination information capable identifying a circuit module, which is an output destination, for each information capable of identifying an FF. In addition, the storage section 802 stores a path selection list in which path selection information indicating which path has been selected within each circuit module and information capable of identifying a circuit module are associated with each other.

The information capable identifying an FF refers to, for example, an FF name given to each FF within a semiconductor integrated circuit. The information capable of identifying a circuit module refers to, for example, a circuit module name given to each circuit module within the semiconductor integrated circuit. Specifically, for example, output sequence information 606, output destination information 603 and a path selection list 601 are stored in a memory unit, such as the RAM 703, the magnetic disk 705, or the optical disk 707.

Next, the specification section 803 specifies circuit modules, among a plurality of circuit modules, in the order in which data is output therefrom as scan data strings. Specifically, for example, the CPU 701 gains access to the memory unit and reads the output sequence information 606. Then, the CPU 701 specifies circuit modules, in the order of output, out of the circuit module name 607 in the output sequence information 606. First, the circuit module N is selected.

The determination section 804 determines which path, between an ordinary path and a short-circuit path, the path selection information of a circuit module specified by the specification section 803 indicates. Specifically, for example, the CPU 701 gains access to the memory unit and reads the path selection list 600. Then, the CPU 701 reads the path selection information 602 from the path selection list 600 on the basis of the specified circuit module name 601. Then, the CPU 701 determines which path, between a short-circuit path and an ordinary path, the read-out path selection information 602 indicates. For example, the path selection information 602 of the circuit module N has a value of 1. Consequently, the path selection information 602 indicates that an ordinary path has been selected in the circuit module N.

Next, if a determination is made by the determination section 804 that the path selection information of a circuit module indicates an ordinary path, then the setting section 805 sets as many scan data strings, among given scan data strings, as the number of FFs included in a shift register within the circuit module in a target scan data string.

Specifically, for example, the CPU 701 sets as many scan data strings as the number of FFs included in the shift register within the circuit module in the target scan data string, according to the scan data string example 5. For example, the number of FFs included in a shift register within the circuit module N is 6. The circuit module N is the first one, among a plurality of circuit modules constituting a scan chain, for which a scan signal is output in the first place. For example, the CPU 701 sets the first to sixth scan data of the scan data string example 5 in the target scan data string, as the scan data string of the circuit module N.

Next, from the target scan data string set by the setting section 805, the detection section 806 detects the path selection information of a circuit module whose path selection information indicating which path has been selected is unknown. Specifically, for example, the CPU 701 gains access to the memory unit and reads the output destination information 603. Then, from the FF name 604, the CPU 701 detects FFs constituting the shift register within the specified circuit module. Then, the CPU 701 detects the circuit module name 605 which is an output destination of the detected FF name 604. The detected circuit module and the target scan data string are associated with each other. Note that the results of detection are stored in a memory unit, such as the RAM 703, the magnetic disk 705, or the optical disk 707.

For example, according to the output destination information 603, the FF 14 and FF 15 constituting the shift register within the circuit module N are detected from the FF name 604. The circuit module M, which is the output destination of the FF 14, is read out. In addition, the circuit module L, which is the output destination of the FF 15, is read out. The scan data fifth from the first scan data and corresponding to the FF 14 in the scan data string example 5 is 0. The scan data fourth from the first scan data and corresponding to the FF 15 in the scan data string example 5 is 1.

The registration section 807 registers path selection information on the basis of detection results provided by the detection section 806. Specifically, for example, the CPU 701 gains access to a memory unit and reads out the detection results. The CPU 701 gains access to the memory unit and reads out the path selection list 600. Then, the CPU 701 searches the detected circuit module name 605 out of the circuit module name 601 of the path selection list 600. Next, the CPU 701 registers the scan data string of the circuit module name 605, as new path selection information 602, with the path selection information 602 of the searched-out circuit module name 601. Note that registration results are stored in a memory unit, such as the RAM 703, the magnetic disk 705, or the optical disk 707. FIG. 9 illustrates the registered path selection list 600.

FIG. 9 is an explanatory drawing illustrating the registered path selection list 600. The path selection information 602 of the circuit module M is registered as 0. In this way, the path selection information 602 of a circuit module whose path selection information is unknown is registered as the result of a scan data string being inspected by the inspection apparatus 800.

Next, referring back to FIG. 8, the association section 808 associates target scan data strings with the identification information of circuit modules. Specifically, for example, the CPU 701 associates target scan data strings with circuit module names.

The output section 809 outputs target scan data strings and the identification information of circuit modules associated with each other by the association section 808. Specifically, for example, the CPU 701 outputs the target scan data strings and the circuit module names. Examples of output forms include display on the display 708, output to the printer 713 for printing, and transmission to external equipment through the I/F 709. Alternatively, the results of association may be stored in a memory unit, such as the RAM 703, the magnetic disk 705, or the optical disk 707. FIG. 10 illustrates an output example.

FIG. 10 is an explanatory drawing illustrating one example of output provided by the inspection apparatus 800. An output example 1000 is comprised of a circuit module name 1001, an FF name 1002, and scan data 1003. For example, the scan data of an FF 6 included in a shift register within the circuit module L is 0.

Figure 11:
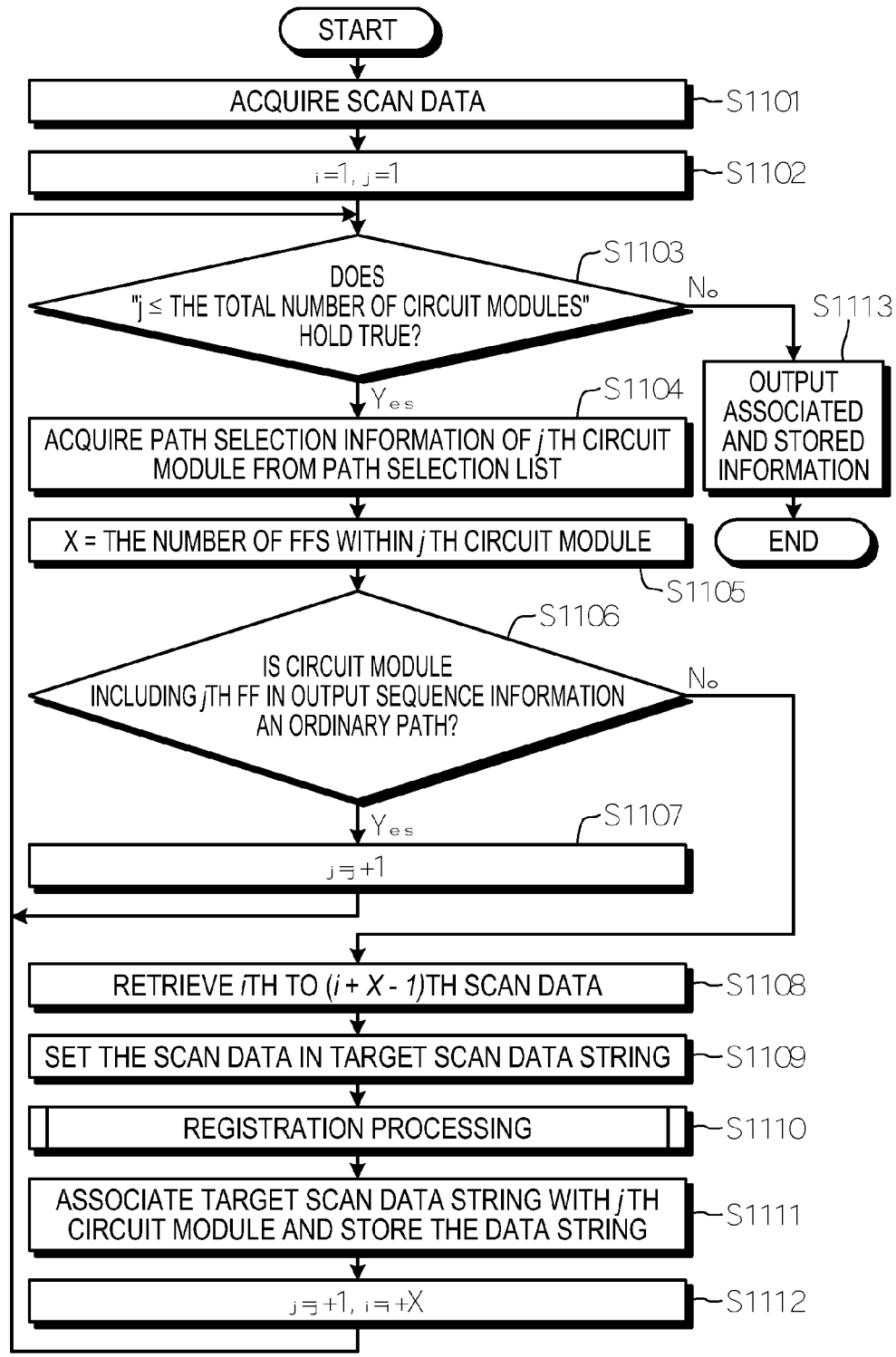
FIG. 11 is a flowchart showing an inspection processing procedure of an inspection apparatus in accordance with an embodiment.

Next, an explanation will be made of the inspection processing procedure of an inspection apparatus 800 in accordance with an embodiment. FIG. 11 is a flowchart showing the inspection processing procedure of the inspection apparatus 800 in accordance with an embodiment. First, a scan data string is acquired by the acquisition section 801 (operation S1101). For example, the acquired scan data string is a scan data string example 5. The condition "i=1, j=1" is set by the specification section 803 (operation S1102) and a determination is made as to whether or not "j≤the total number of circuit modules" holds true (operation S1103).

If a determination is made that "j≤the total number of circuit modules" holds true (operation S1103: Yes), then the path selection information of a jth circuit module is acquired from a path selection list stored by the storage section 802 (operation S1104). The path selection list refers to the path selection list 600. The path selection information refers to the path selection information 602. The condition "X=the number of FFs within jth circuit module" is set (operation S1105) and a determination is made by the determination section 804 as to whether or not a circuit module including a jth FF in the output sequence information is a short-circuit path (operation S1106). The output sequence information refers to the output sequence information 606 and is stored by the storage section 802.

If a determination is made that the circuit module including the jth FF in the output sequence information is a short-circuit path (operation S1106: Yes), then the condition "j=j+1" is set by the specification section 803 (operation S1107) and the system goes back to operation S1103.

On the other hand, if a determination is made that the circuit module including the jth FF in the output sequence information is not a short-circuit path (operation S1106: No), then jth to (i+X−1)th scan data are retrieved (operation S1108). The retrieved scan data string is set in a target scan data string by the setting section 805 (operation S1109), and registration processing is executed (operation S1110). The target scan data string is associated with the jth circuit module by the association section 808 and is stored (operation S1111). Then, the condition "j=j+1, i=i+X" is set by the specification section 803 (operation S1112), and the system goes back to operation S1103.

On the other hand, if a determination is made that "j≤the total number of circuit modules" does not hold true (operation S1103: No), then the associated and stored information is output by the output section 809 (operation S1113) and a series of processes terminates.

Figure 12:
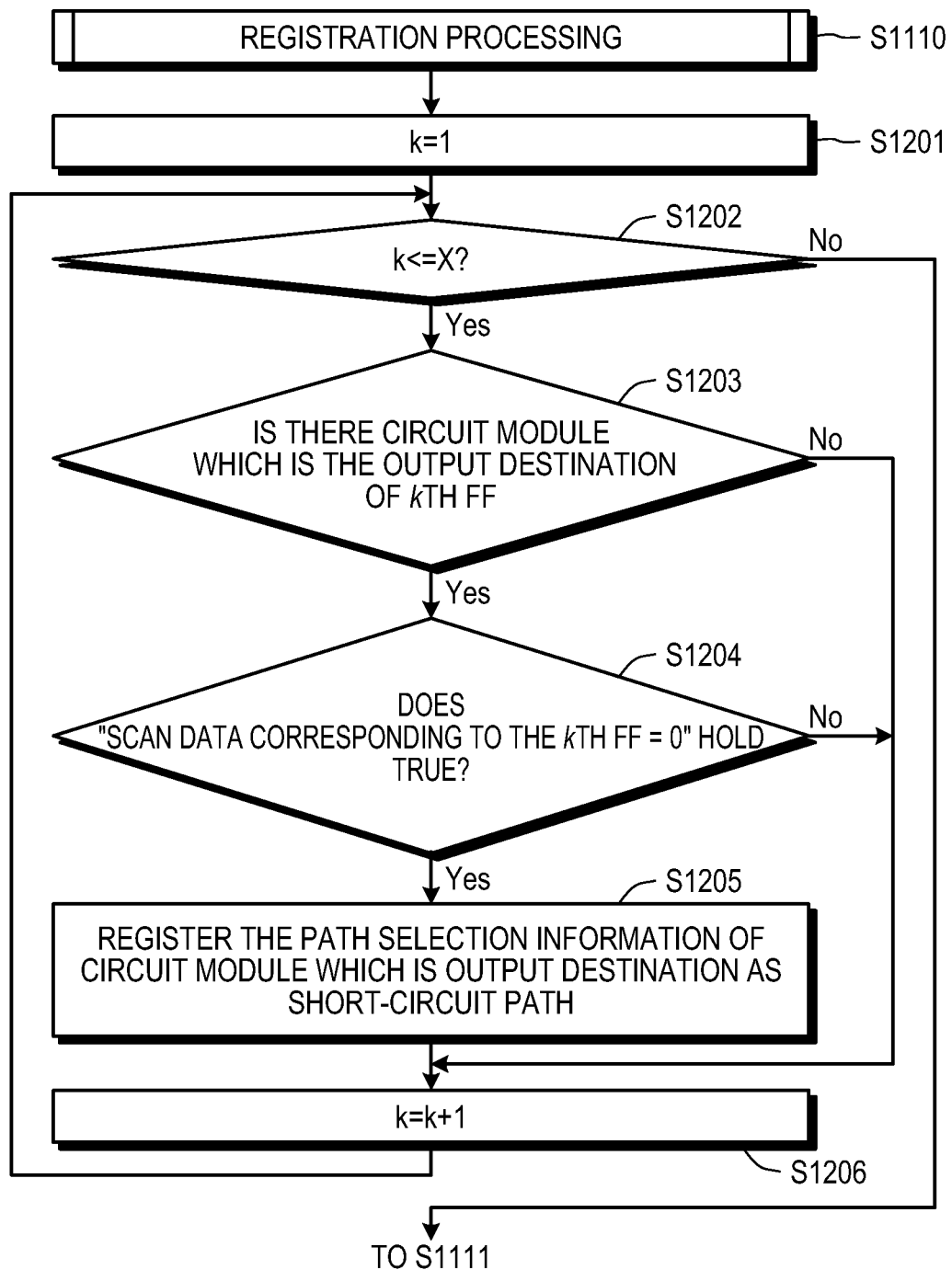
FIG. 12 is a flowchart showing a registration processing procedure.

Next, an explanation will be made of the above-described registration processing (operation S1110). FIG. 12 is a flowchart showing a registration processing procedure. First, the condition "k=1" is set (operation S1201) and a determination is made whether or not k≤X holds true (operation S1202). If a determination is made that k≤X holds true (operation S1202: Yes), then a determination is made by the detection section 806 as to whether or not there is a circuit module which is the output destination of a kth FF (operation S1203). If a determination is made that there is the circuit module which is the output destination of the kth FF (operation S1203: Yes), then a determination is made as to whether or not "scan data corresponding to the kth FF=0" holds true (operation S1204).

If a determination is made that "scan data corresponding to the kth FF=0" holds true (operation S1204: Yes), then the path selection information 602 of the circuit module, which is an output destination, is registered as a short-circuit path by the registration section 807 (operation S1205). Then, the condition "k=k+1" is set (operation S1206) and the system goes back to operation S1202. On the other hand, if a determination is made that there is no circuit module which is the output destination of the kth FF (operation S1203: No) or that "scan data corresponding to the kth FF=0" does not hold true (operation S1204: No), then the system goes to operation S1206.

On the other hand, if a determination is made that k≤X does not hold true (operation S1202: No), then the system goes to operation S1111.

In an embodiment, scan data strings output from the semiconductor integrated circuit explained in above-identified embodiment are inspected. Consequently, it is possible to make debugging easy. In the present embodiment, scan data strings output from a semiconductor integrated circuit 400 will be taken as an example to explain an inspection apparatus. Note that constituent elements identical to those explained in above-identified embodiment(s) are denoted by like reference numerals and characters and will not be explained again.

Figure 13:
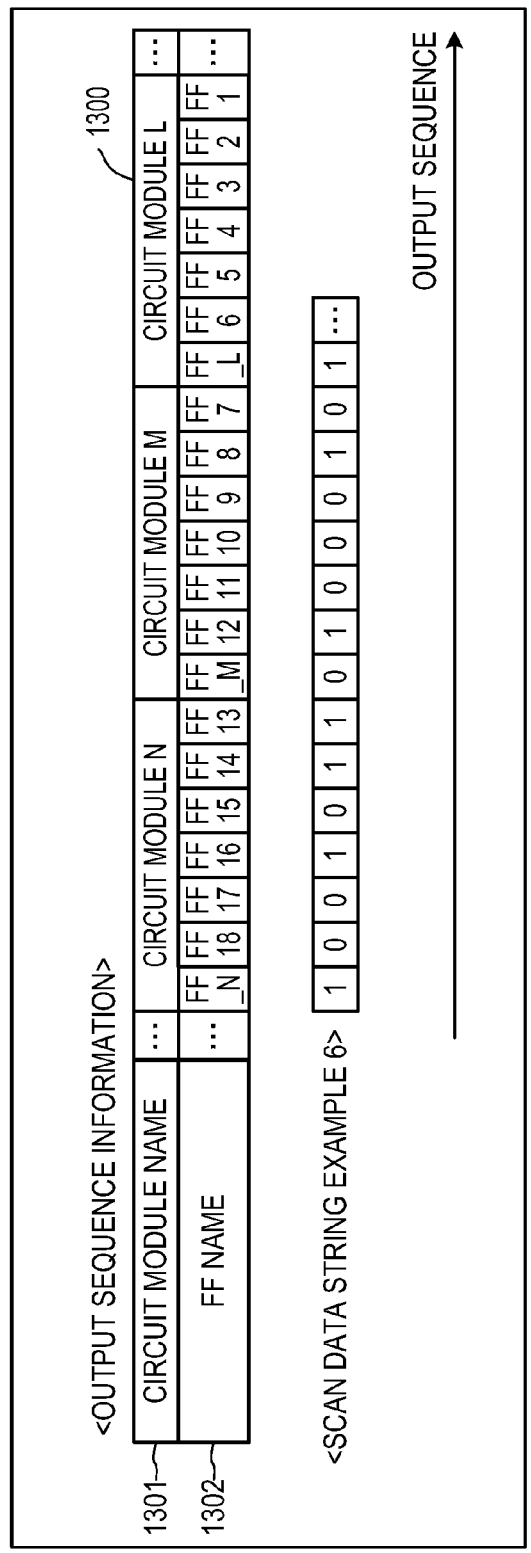
FIG. 13 is an explanatory drawing illustrating an example of output sequence information and an example of a scan data string in accordance with an embodiment.

FIG. 13 is an explanatory drawing illustrating an example of output sequence information and an example a scan data string in accordance with an embodiment. Output sequence information 1300 is comprised of a circuit module name 1301 and an FF name 1302. For example, FF names included in a shift register within a circuit module whose circuit module name 1301 is a circuit module N are an FF_N and FFs 13 to 18. Note that the output sequence information 1300 is stored in a memory unit, such as the RAM 703, the magnetic disk 705, or the optical disk 707.

A scan data string example 6 shows an example of a scan data string. The scan data string example 6 is output from the semiconductor integrated circuit 400 in the order of output denoted by an arrow. Assume that the semiconductor integrated circuit 400 has the configuration of FIG. 4A and is further comprised of a circuit module N and a circuit module L. Also assume that the circuit module N and the circuit module L respectively include a retaining circuit and an appending circuit.

Figure 14:
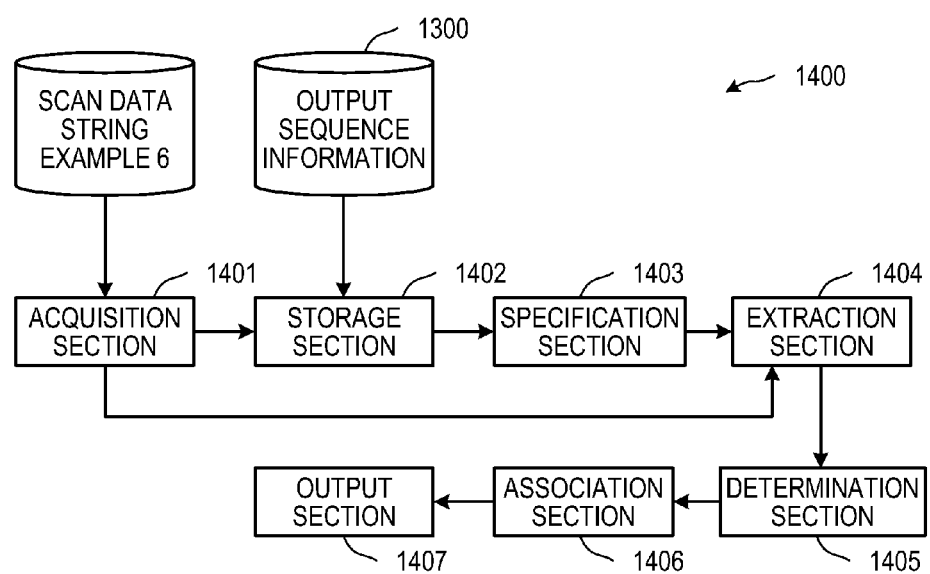
FIG. 14 is a block diagram illustrating a functional configuration of an inspection apparatus in accordance with an embodiment.

Next, an explanation will be made of the functional configuration of an inspection apparatus. FIG. 14 is a block diagram illustrating the functional configuration of an inspection apparatus in accordance with an embodiment. An inspection apparatus 1400 is comprised of an acquisition section 1401, a storage section 1402, a specification section 1403, an extraction section 1404, a determination section 1405, an association section 1406, and an output section 1407.

Specifically, functions (acquisition section 1401 to output section 1407) which serve as a control section of the inspection apparatus 1400 are realized by, for example, letting a program stored in a memory unit, such as the ROM 702, the RAM 703, the magnetic disk 705 or the optical disk 707 illustrated in FIG. 7 be executed by the CPU 701, or by using the I/F 709.

First, the acquisition section 1401 acquires a scan data string output from a semiconductor integrated circuit. Specifically, for example, the CPU 701 acquires a scan data string example 6 output from the output terminal 105 of the semiconductor integrated circuit 400 through the I/F 715 dedicated to JTAG or scan testing. Note that the acquired scan data string example 6 is stored in a memory unit, such as the RAM 703, the magnetic disk 705, or the optical disk 707.

The storage section 1402 stores output sequence information in which pieces of information capable of identifying FFs are arrayed in the order of output. Specifically, for example, output sequence information 1300 is stored in a memory unit, such as the RAM 703, the magnetic disk 705, or the optical disk 707.

Next, the specification section 1403 specifies circuit modules, among a plurality of circuit modules, in the order in which data is output therefrom as a scan data string. Specifically, for example, the CPU 701 gains access to the memory unit and reads out the output sequence information 1300. Then, the CPU 701 specifies circuit modules, in the order of output, out of the circuit module name 1301 in the output sequence information 1300. Assume that a circuit module N is selected here. Note that the results of specification are stored in a memory unit, such as the RAM 703, the magnetic disk 705, or the optical disk 707.

Next, according to the output sequence information 1300, the extraction section 1404 extracts scan data corresponding to path selection information within the circuit module specified by the specification section 1403 from the scan data string acquired by the acquisition section 1401. Specifically, for example, the CPU 701 reads out the FF name 1302 of a first FF from among a plurality of FFs included in the shift register within the specified circuit module. In the case of the circuit module N, for example, the first FF name 1302 is an FF_N. The first scan data, among scan data strings of respective circuit modules output from the semiconductor integrated circuit 400, is the path selection information.

Then, for example, the CPU 701 extracts scan data corresponding to the FF_N from the scan data string example 6. Note that the results of extraction are stored in a memory unit, such as the RAM 703, the magnetic disk 705, or the optical disk 707.

The determination section 1405 determines which path, between an ordinary path and a short-circuit path, the scan data which is path selection information extracted by the extraction section 1404 indicates. Specifically, for example, the CPU 701 determines whether the value of the extraction results is 1 or 0. For example, the path selection information of the circuit module N has a value of 1. Consequently, the path selection information indicates that an ordinary path has been selected in the circuit module N. Note that the results of determination are stored in a memory unit, such as the RAM 703, the magnetic disk 705, or the optical disk 707.

Next, if a determination is made by the determination section 1405 that the path selection information indicates an ordinary path, then the association section 1406 associates as many scan data strings, among given scan data strings, as the number of FFs included in the shift registers within the circuit modules with the identification information of the circuit modules. Specifically, if the path selection information indicates, for example, an ordinary path, then the CPU 701 associates as many scan data strings as the number of FFs included in the shift register within the specified circuit module with circuit module names, according to the scan data string example 6.

Figure 15:
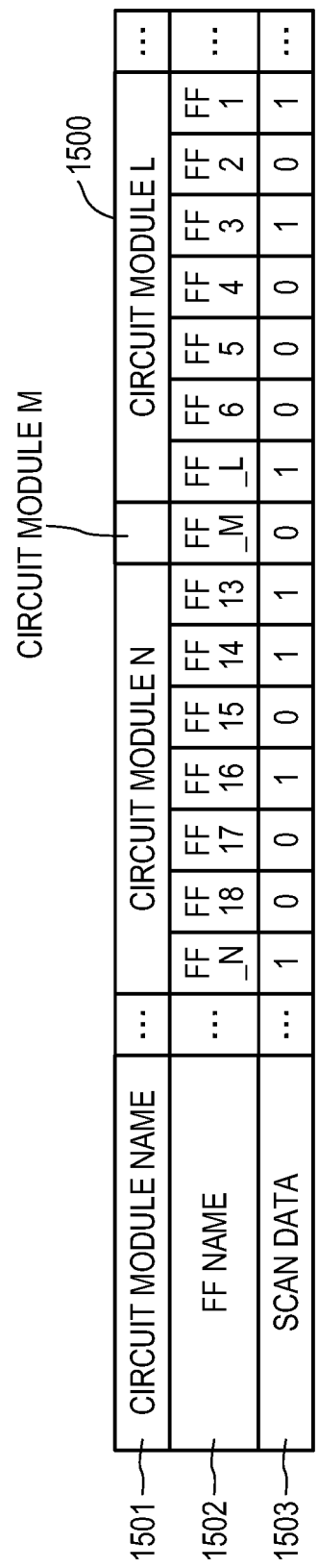
FIG. 15 is an explanatory drawing illustrating one example of output provided by an inspection apparatus.

The output section 1407 outputs the results of association provided by the association section 1406. Specifically, for example, the CPU 701 outputs the scan data strings and the circuit module names associated with each other. Examples of output forms include display on the display 708, output to the printer 713 for printing, and transmission to external equipment through the I/F 709. Alternatively, the results of association may be stored in a memory unit, such as the RAM 703, the magnetic disk 705, or the optical disk 707. FIG. 15 illustrates an output example.

FIG. 15 is an explanatory drawing illustrating one example of output provided by an inspection apparatus 1400. An output example 1500 is comprised of a circuit module name 1501, an FF name 1502, and a scan data string 1503. For example, if the circuit module name 1501 is a circuit module M, only FF_M is associated with a scan data string. The FF_M is the path selection information of the circuit module M. The FF_M has a scan data value of 0. Accordingly, a short-circuit path is selected in the circuit module M and, therefore, only the FF_M is associated with scan data.

Now, an explanation will be made of the inspection processing procedure of the inspection apparatus 1400 in accordance with an embodiment. FIG. 16 is a flowchart showing the inspection processing procedure of the inspection apparatus 1400 in accordance with an embodiment. First, a scan data string is acquired by the acquisition section 1401 (operation S1601). For example, the scan data string is the scan data string example 6. Next, the condition "n=1, m=1" is set by the specification section 1403 (operation S1602). This operation specifies an mth circuit module in the output sequence information 1300 stored by the storage section 1402. Then, a determination is made as to whether or not "m≤the total number of circuit modules" holds true (operation S1603).

If a determination is made that "m≤the total number of circuit modules" holds true (operation S1603: Yes), then nth scan data is extracted by the extraction section 1404 as the path selection information of the mth circuit module (operation S1604). Then, the condition "n=n+1" is set (operation S1605) and a determination is made by the determination section 1405 as to whether or not the extracted path selection information indicates an ordinary path (operation S1606).

If a determination is made that the extracted path selection information indicates a ordinary path (operation S1606: Yes), then the condition "X=the number of FFs within mth circuit module" is set (operation S1607). In addition, nth to (n+X)th scan data and an mth circuit module name are associated with each other by the association section 1406 and the results of association are stored (operation S1608). The condition "m=m+1, n=n+X" is set by the specification section 1403 (operation S1609), and the system goes back to operation S1603.

On the other hand, if the extracted path selection information is determined as not indicating an ordinary path (operation S1606: No), then the system goes to operation S1609. If a determination is made that "m≤the total number of circuit modules" does not hold true (operation S1603: No), then the associated and stored information is output by the output section 1407 (operation S1610) and a series of processes terminates.

As has been described heretofore, according to the circuit modules and the semiconductor integrated circuit, it is possible to promote the efficiency of scan tests by diverting a control signal for controlling the operation of circuit modules for use as a control signal for selecting a path. In addition, it is possible to shorten scan data and thereby reduce a test time. Furthermore, a test may be performed irrespective of the number of terminals.

If the operation of a scan test is not permitted by a scan operation signal, then the control signal is retained. If the operation of the scan test is permitted, then the control signal is output to a selection circuit. Consequently, a path is fixed during a scan test, thereby making it possible to promote the efficiency of the scan test.

In addition, path selection information indicating which path, between an ordinary path and a short-circuit path, has been selected is added to a scan signal for each circuit module. Consequently, by observing the value of scan data, a user (designer or inspector) may determine which path each circuit module has selected. Accordingly, it is possible to promote the efficiency of a scan test. It is also possible to make debugging easy.

The output data of FFs included in a shift register within a circuit module is supplied as a control signal to circuit modules the output data which is output later than that of the former circuit module. Consequently, by observing the scan data values of other modules, a user may determine which path has been selected. Accordingly, it is possible to promote the efficiency of a scan test and make debugging easy.

As has been described heretofore, according to the inspection apparatus, a scan data string output from the semiconductor integrated circuit is acquired, the path selection information of circuit modules whose path selection information is unknown is registered, and scan data corresponding to each circuit module and the identification information thereof are associated with each other and then output. Consequently, a determination is made automatically as to which FF, among FFs constituting a scan chain, each scan data within the scan data string corresponds to. Thus, it is possible to make debugging easy.

As has been described heretofore, according to the inspection apparatus, a scan data string output from the semiconductor integrated circuit is acquired, the path selection information of each circuit module is extracted out of the scan data string, and a determination is made as to which path has been selected. If the selected path is determined to be an ordinary path, then scan data corresponding to each circuit module and the identification information thereof are associated with each other according to the scan data string, and then output.

Consequently, a determination is made automatically as to which FF, among FFs constituting a scan chain, each scan data within the scan data string corresponds to. Thus, it is possible to make debugging easy. In addition, since path selection information is included in the scan data string, there is no need for lists of output destination information, path selection information, and the like. Thus, it is possible to perform debugging only by using scan data strings and output sequence information.

Note that the inspection method explained in the present embodiment may be realized by executing a previously prepared program on a computer, such as a personal computer or a workstation.

The inspection program is recorded on a computer-readable recording medium, such as a hard disk, a flexible disk, a CD-ROM, an MO or a DVD and is executed as the result of being read out from the recording medium by the computer. The inspection program may be distributed through a network, such as the Internet.

In addition, the inspection apparatus 800 and the inspection apparatus 1400 explained in the above-described embodiment may also be realized by using ICs intended for specific applications (hereinafter simply referred to as "ASICs"), such as standard cells and structured ASICs (Application Specific Integrated Circuits), or by using PLDs (Programmable Logic Devices), such as FPGAs. Specifically, for example, by functionally defining the function(s) of the above-described inspection apparatus 800 (acquisition section 801 to output section 809) or the functions of the inspection apparatus 1400 (acquisition section 1401 to output section 1407) using an HDL description, logically synthesizing the HDL description, and providing the HDL description to ASICs or PLDs, it is possible to manufacture the inspection apparatus 800 or the inspection apparatus 1400.

As such, the embodiments can be implemented in computing hardware (computing apparatus) and/or software, such as (in a non-limiting example) any computer that can store, retrieve, process and/or output data and/or communicate with other computers. The results produced can be displayed on a display of the computing hardware. A program/software implementing the embodiments may be recorded on computer-readable media comprising computer-readable recording media. The program/software implementing the embodiments may also be transmitted over transmission communication media. Examples of the computer-readable recording media include a magnetic recording apparatus, an optical disk, a magneto-optical disk, and/or a semiconductor memory (for example, RAM, ROM, etc.). Examples of the magnetic recording apparatus include a hard disk device (HDD), a flexible disk (FD), and a magnetic tape (MT). Examples of the optical disk include a DVD (Digital Versatile Disc), a DVD-RAM, a CD-ROM (Compact Disc-Read Only Memory), and a CD-R (Recordable)/RW. An example of communication media includes a carrier-wave signal.

Further, according to an aspect of the embodiments, any combinations of the described features, functions and/or operations can be provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention, the scope of which is defined in the claims and their equivalents.

What is claimed is:

1. A circuit module, comprising:
a plurality of shift registers constituting part of a scan chain within a semiconductor integrated circuit;
a control signal generation unit configured to generate a clock gating signal for the scan chain, whereby the shift registers are enabled;
a clock gating circuit configured to supply a clock signal to the shift registers and controlled by the clock gating signal, the clock signal not being supplied to the shift registers when the clock gating signal is not set; and
a selection unit configured to select either a short-circuit path through which a scan signal does not go through the shift registers or an ordinary path through which the scan signal goes through the shift registers, and controlled by the clock gating signal, where the short circuit path is selected when the clock gating signal is not set.

2. The circuit module according to claim 1, comprising:
a retaining unit which, when a scan operation signal for controlling scan operation generated within the semiconductor integrated circuit does not permit scan operation, retains a value and, when the scan operation signal permits scan operation, outputs the retained value to the selection unit.

3. The circuit module according to claim 1, comprising:
an appending unit which adds information indicating which path, between the short-circuit path and the ordinary path, has been selected by the selection unit, to a signal loaded by the selection unit and outputs the signal.

4. The circuit module according to claim 2, comprising:
an appending unit which adds information indicating which path, between the short-circuit path and the ordinary path, has been selected by the selection unit, to a signal loaded by the selection unit and then outputs the signal.

5. A semiconductor integrated circuit, comprising:
a plurality of circuit modules including shift registers constituting a scan chain;
a control signal generation unit configured to generate a clock gating signal for each of the circuit modules, whereby the shift registers are enabled;
a clock gating circuit configured to supply a clock signal to the shift registers of each of the circuit modules and controlled by the clock gating signal, the clock signal is not supplied to the shift registers of each of the circuit modules when the clock gating signal is not set; and
a selection unit configured to select either a short-circuit path through which a scan signal for each of the circuit modules does not go through the shift registers or an ordinary path through which the scan signal goes through the shift registers, and controlled by the clock gating signal, where the short-circuit path is selected when the clock gating signal is not set.

6. The semiconductor integrated circuit according to claim 5, comprising:
a retaining unit which, when the operation of the shift registers is not permitted, retains a value and, when the operation of the shift registers is permitted, outputs the retained value to the selection unit.

7. The semiconductor integrated circuit according to claim 5, comprising:
an appending unit for adding information indicating which path, between the short-circuit path and the ordinary path, has been selected by the selection unit, to a signal loaded by the selection unit and outputting the signal.

8. The semiconductor integrated circuit according to claim 5, wherein the control signal generation unit supplies, as a control signal, the output data of a data-retaining element included in the shift registers within the circuit module to a circuit module the output data of which is output later than that of the circuit module.

9. A system having an inspection apparatus for inspecting a semiconductor integrated circuit, comprising:
a plurality of circuit modules including shift registers constituting a scan chain;
a control signal generation unit configured to generate a control signal for each of the circuit modules, whereby the shift registers are enabled; and
a clock gating circuit configured to supply a clock signal to the shift registers of each of the circuit modules and controlled by the clock gating signal, the clock signal is not supplied to the shift registers of each of the circuit modules when the clock gating signal is not set; and
a selection unit configured to select either a short-circuit path through which a scan signal for each of the circuit modules does not go through the shift registers or an ordinary path through which the scan signal goes through the shift registers, and controlled by the clock gating signal, the short-circuit path is selected when the clock gating signal is not set;
wherein;
the inspection apparatus including:
an acquisition unit for acquiring a scan data string output from the semiconductor integrated circuit;
a storage unit for storing output destination information identifying one of the circuit modules which is an output destination, and output sequence information indicating the output sequence of the shift registers of each of the circuit modules;
a detection unit for detecting path selection information of one of the circuit modules, whose path selection information indicating which path has been selected is unknown, from a target scan data string, according to output destination information stored by the storage unit;
a specification unit for specifying circuit modules, among the plurality of circuit modules, in an order of output, according to the output sequence information stored by the storage unit;
a determination unit for determining which path, between the ordinary path and the short-circuit path, path selection information detected with respect to the circuit modules specified by the specification unit indicates;
a setting unit for setting as many scan data strings, among scan data strings acquired by the acquisition unit, as a number of data-retaining elements included in the shift registers within the circuit module in the target scan data string, when a determination is made by the determination unit that the ordinary path is indicated;
an association unit for associating the target scan data string with the identification information of the circuit modules; and
an output unit for outputting a result of association provided by the association unit.

* * * * *